United States Patent
Jung et al.

(10) Patent No.: US 12,002,905 B2
(45) Date of Patent: Jun. 4, 2024

(54) LIGHT EMITTING ELEMENT, DISPLAY DEVICE INCLUDING THE SAME, AND METHOD FOR MANUFACTURING THE DISPLAY DEVICE

(71) Applicant: Samsung Display Co., Ltd., Yongin-si (KR)

(72) Inventors: Jae Hoon Jung, Seoul (KR); Sung Chan Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 657 days.

(21) Appl. No.: 17/250,713

(22) PCT Filed: Jan. 3, 2019

(86) PCT No.: PCT/KR2019/000115
§ 371 (c)(1),
(2) Date: Feb. 23, 2021

(87) PCT Pub. No.: WO2020/040368
PCT Pub. Date: Feb. 27, 2020

(65) Prior Publication Data
US 2021/0202800 A1 Jul. 1, 2021

(30) Foreign Application Priority Data
Aug. 24, 2018 (KR) .................. 10-2018-0099339

(51) Int. Cl.
*H01L 33/44* (2010.01)
*B82B 3/00* (2006.01)
(Continued)

(52) U.S. Cl.
CPC ............ *H01L 33/44* (2013.01); *B82B 3/0052* (2013.01); *C07F 5/027* (2013.01); *C07F 7/1804* (2013.01);
(Continued)

(58) Field of Classification Search
CPC .......................... H01L 25/0753; H01L 33/44
See application file for complete search history.

(56) References Cited

U.S. PATENT DOCUMENTS 9,803,137 B2   10/2017   Kuzumoto et al.
2011/0240922 A1   10/2011   Jun et al.
(Continued)

FOREIGN PATENT DOCUMENTS

CN   102971873 A   3/2013
CN   103608937 A   2/2014
(Continued)

OTHER PUBLICATIONS

Office action issued in corresponding Chinese Patent Application No. 201980054080, dated Sep. 26, 2023, 8pp.
(Continued)

*Primary Examiner* — Daniel P Shook
(74) *Attorney, Agent, or Firm* — Lewis Roca Rothgerber Christie LLP

(57) ABSTRACT

A light emitting device, a display device comprising same, and a method for manufacturing a display device are provided. The light emitting device comprises: a first conductivity type semiconductor doped to have a first polarity, an active layer on the first conductivity type semiconductor, a second conductivity type semiconductor on the active layer and doped to have a second polarity different from the first polarity and an insulating material layer surrounding side surfaces of the first conductivity type semiconductor, the second conductivity type semiconductor, and the active layer, wherein the insulating material layer includes an insulating material film and an element orienter bonded to an outer peripheral surface of the insulating material film.

19 Claims, 10 Drawing Sheets

(51) Int. Cl.
  *C07F 5/02* (2006.01)
  *C07F 7/18* (2006.01)
  *H01L 25/075* (2006.01)
  *H01L 27/12* (2006.01)
  *H01L 33/24* (2010.01)
  *H01L 33/38* (2010.01)
  *H01L 33/62* (2010.01)

(52) U.S. Cl.
  CPC ...... H01L 25/0753 (2013.01); H01L 27/1214 (2013.01); H01L 33/24 (2013.01); H01L 33/38 (2013.01); H01L 33/62 (2013.01); *H01L 2933/0016* (2013.01); *H01L 2933/0025* (2013.01); *H01L 2933/0066* (2013.01)

(56) References Cited

U.S. PATENT DOCUMENTS

| | | |
|---|---|---|
| 2013/0027623 A1 | 1/2013 | Negishi et al. |
| 2016/0115383 A1 | 4/2016 | Kuzumoto et al. |
| 2017/0200859 A1 | 7/2017 | Do et al. |
| 2018/0019369 A1* | 1/2018 | Cho ............... H05K 1/181 |

FOREIGN PATENT DOCUMENTS

| | | |
|---|---|---|
| CN | 107611153 A | 1/2018 |
| KR | 10-1997-0030948 A | 6/1997 |
| KR | 10-2008-0074621 A | 8/2008 |
| KR | 10-2012-0122160 A | 11/2012 |
| KR | 10-2012-0138805 A | 12/2012 |
| KR | 10-2017-0048311 A | 5/2017 |
| KR | 10-2017-0083191 A | 7/2017 |
| KR | 10-2017-0133717 A | 12/2017 |
| KR | 10-2018-0007376 A | 1/2018 |
| KR | 10-2018-0009014 A | 1/2018 |

OTHER PUBLICATIONS

International Search Report for corresponding Application No. PCT/KR2019/000115 dated Jun. 11, 2019, 4 pp.
Notice of Allowance issued in corresponding Korean Patent Application No. KR 10-2018-0099339, dated Jul. 26, 2023, 2pp.

* cited by examiner

LIGHT EMITTING ELEMENT, DISPLAY DEVICE INCLUDING THE SAME, AND METHOD FOR MANUFACTURING THE DISPLAY DEVICE

CROSS-REFERENCE TO RELATED APPLICATION

This application is a U.S. National Phase Patent Application of Korean International Application No. PCT/KR2019/000115, filed Jan. 3, 2019, which claims priority to Korean Patent Application No. 10-2018-0099339, filed on Aug. 24, 2018, in the Korean Intellectual Property Office, the entire content of all of which is hereby incorporated by reference.

TECHNICAL FIELD

Embodiments of the present disclosure relate to a light emitting element, a display device including the same, and a method for manufacturing the display device, and more particularly, to a light emitting element having an increased dielectric anisotropy by an element orienter bonded to an outer surface thereof, a display device including the same and a method for manufacturing the display device.

BACKGROUND

The importance of display devices has steadily increased with the development of multimedia technology. Accordingly, various types of display devices such as an organic light emitting display (OLED), a liquid crystal display (LCD) and the like have been used.

A display device is a device for displaying an image, and includes a display panel, such as an organic light emitting display panel or a liquid crystal display panel. Among them, a light emitting display panel may include a light emitting element. Examples of a light emitting diode (LED) include an organic light emitting diode (OLED) using an organic material as a fluorescent material, and an inorganic light emitting diode using an inorganic material as a fluorescent material.

The organic light emitting diode (OLED) using an organic material as a fluorescent material of a light emitting element has advantages in that a manufacturing process is simple and a display device can have flexibility. However, it is known that the organic material is vulnerable to a high-temperature operating environment and the blue light efficiency is relatively low.

On the other hand, the inorganic light emitting diode using an inorganic semiconductor as a fluorescent material has advantages in that it has durability even in a high-temperature environment and the blue light efficiency is high compared to the organic light emitting diode. Also, in the manufacturing process, as noted as a drawback of a conventional inorganic light emitting diode, a transfer method using a dielectrophoresis (DEP) method has been developed. Accordingly, continuous studies have been conducted on the inorganic light emitting diode having superior durability and efficiency compared to the organic light emitting diode.

DISCLOSURE

Technical Problem

Aspects of embodiments of the present disclosure provide a light emitting element in which an element orienter capable of forming an intra-molecular dipole is bonded to an outer surface thereof and a display device including the same.

Aspects of embodiments of the present disclosure also provide a display device in which dielectrophoretic reactivity is improved by bonding the element orienter to increase dielectric anisotropy, and the alignment degree of light emitting elements arranged between electrodes is increased.

It should be noted that aspects of embodiments of the present disclosure are not limited to the above-mentioned aspects, and other unmentioned aspects of embodiments of the present disclosure will be clearly understood by those skilled in the art from the following descriptions.

SUMMARY

According to an embodiment of the present disclosure, a light emitting element includes a first conductivity type semiconductor doped to have (e.g., doped with) a first polarity, an active layer on the first conductivity type semiconductor, a second conductivity type semiconductor on the active layer and doped to have (e.g., doped with) a second polarity different from the first polarity and an insulating material layer surrounding side surfaces of the first conductivity type semiconductor, the second conductivity type semiconductor, and the active layer, wherein the insulating material layer includes an insulating material film and an element orienter bonded to an outer peripheral (e.g., circumferential) surface of the insulating material film.

The element orienter may include a compound represented by the following chemical structural formula (1):

[Chemical Structural Formula (1)]

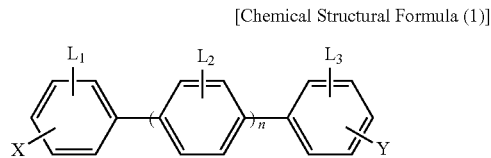

where X is —OR or —NR$_2$, Y is one selected from —NR$_3^+$, —C$_m$F$_l$ and —CN, at least one selected from L$_1$, L$_2$ and L$_3$ is one selected from —Si(OH)$_3$, —Si(OR)$_3$, —(R)Si(OH)$_3$, —(R)Si(OR)$_3$, —B(OH)$_2$, —B(OR)$_2$, —(R)B(OH)$_2$ and —(R)B(OR)$_2$, the other is hydrogen (H), each R is independently one selected from hydrogen, a C$_1$-C$_6$ alkyl group, a C$_1$-C$_6$ alkenyl group and a C$_1$-C$_6$ alkynyl group, n is an integer of 0 to 3, and m and l are each independently an integer of 1 to 10.

The element orienter may include at least one of compounds represented by the following chemical structural formulas (1-1) to (1-12):

[Chemical Structural Formula (1-1)]

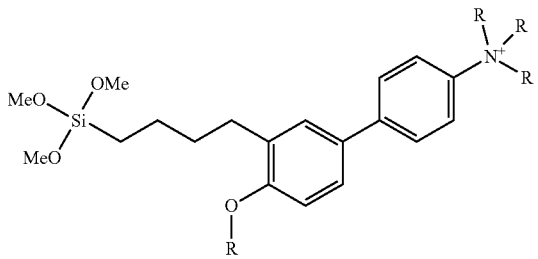

[Chemical Structural Formula (1-2)]

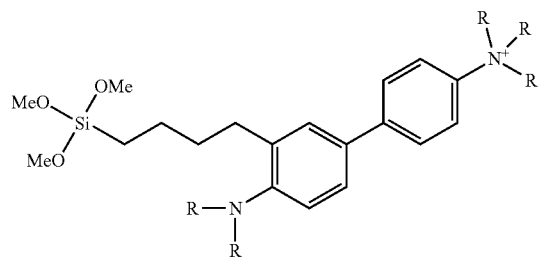

[Chemical Structural Formula (1-3)]

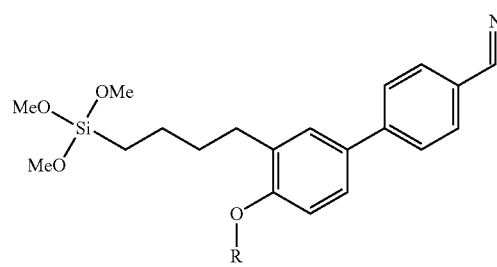

[Chemical Structural Formula (1-4)]

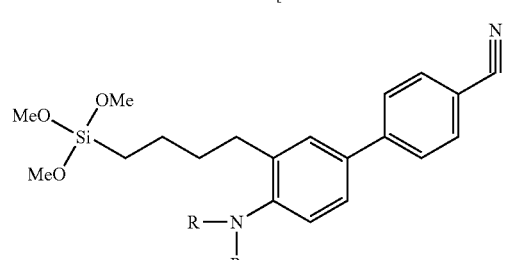

[Chemical Structural Formula (1-5)]

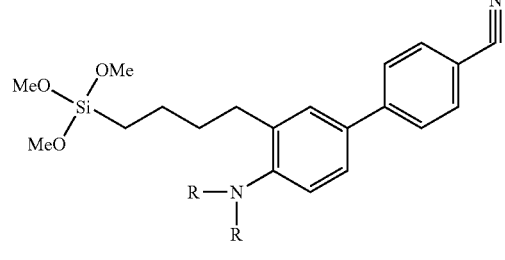

[Chemical Structural Formula (1-6)]

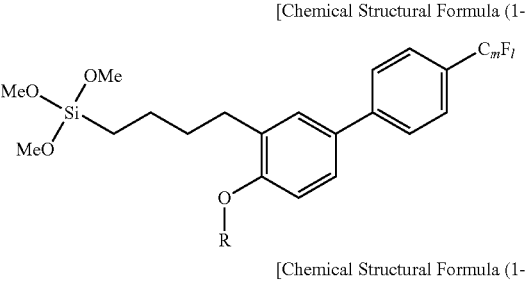

[Chemical Structural Formula (1-7)]

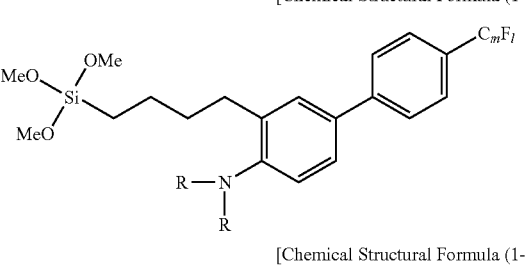

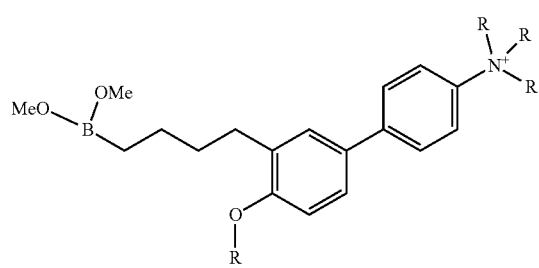

[Chemical Structural Formula (1-8)]

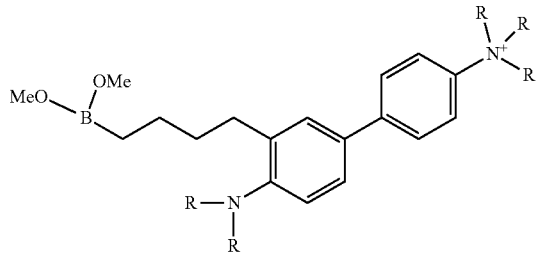

[Chemical Structural Formula (1-9)]

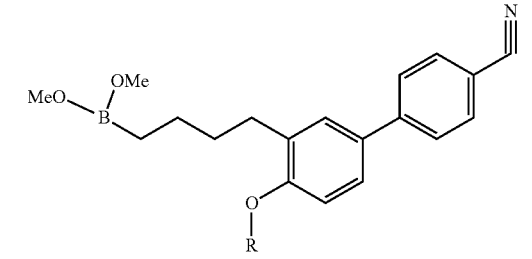

[Chemical Structural Formula (1-10)]

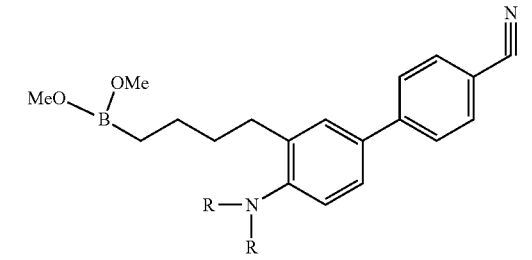

[Chemical Structural Formula (1-11)]

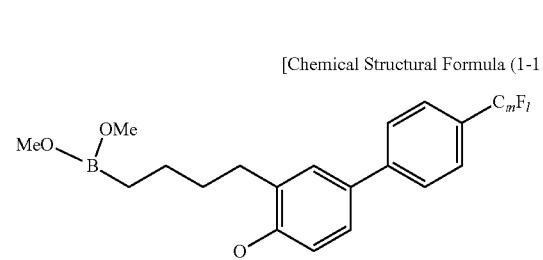

[Chemical Structural Formula (1-12)]

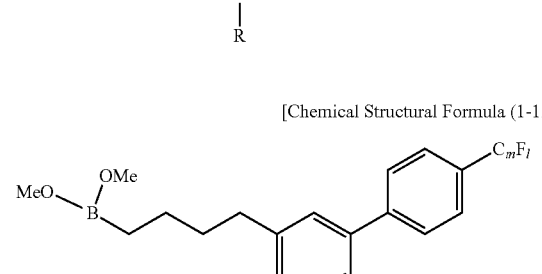

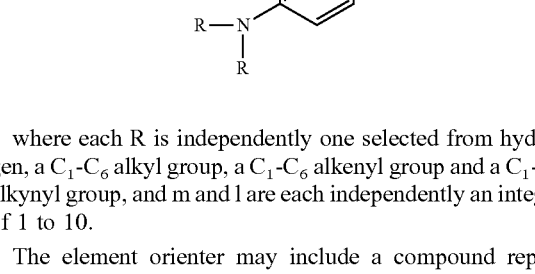

where each R is independently one selected from hydrogen, a $C_1$-$C_6$ alkyl group, a $C_1$-$C_6$ alkenyl group and a $C_1$-$C_6$ alkynyl group, and m and l are each independently an integer of 1 to 10.

The element orienter may include a compound represented by the following chemical structural formula (2):

[Chemical Structural Formula (2)]

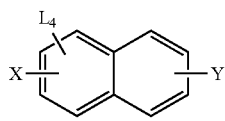

where X is —OR or —NR$_2$, Y is one selected from —NR$_3$*, —C$_m$F$_l$ and —CN, L$_4$ is one selected from —Si(OH)$_3$, —Si(OR)$_3$, —(R)Si(OH)$_3$, —(R)Si(OR)$_3$, —B(OH)$_2$, —B(OR)$_2$, —(R)B(OH)$_2$ and —(R)B(OR)$_2$, each R is independently one selected from hydrogen, a C$_1$-C$_6$ alkyl group, a C$_1$-C$_6$ alkenyl group and a C$_1$-C$_6$ alkynyl group, and m and l are each an integer of 1 to 5.

The element orienter may include at least one of compounds represented by the following chemical structural formulas (2-1) to (2-12):

[Chemical Structural Formula (2-1)]

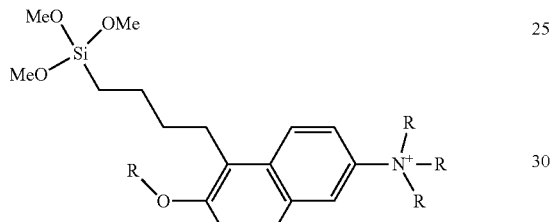

[Chemical Structural Formula (2-2)]

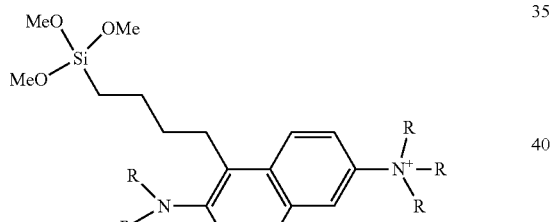

[Chemical Structural Formula (2-3)]

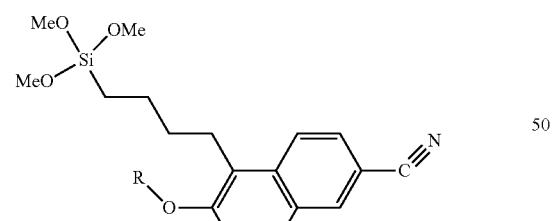

[Chemical Structural Formula (2-4)]

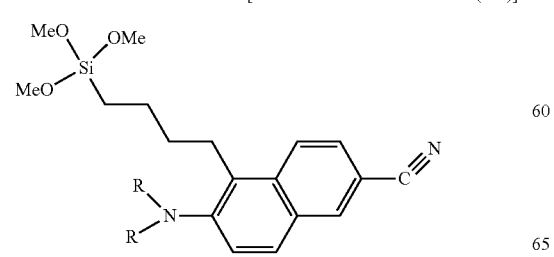

[Chemical Structural Formula (2-5)]

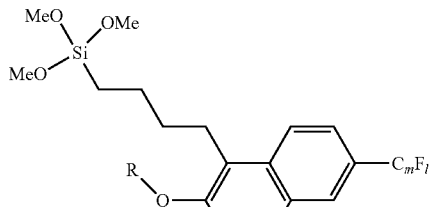

[Chemical Structural Formula (2-6)]

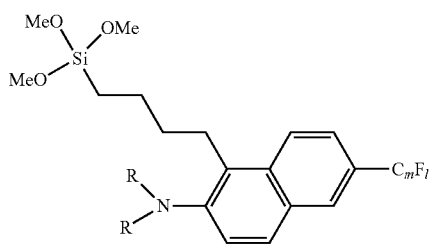

[Chemical Structural Formula (2-7)]

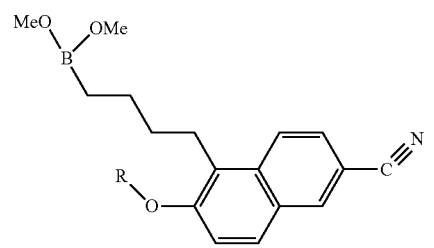

[Chemical Structural Formula (2-8)]

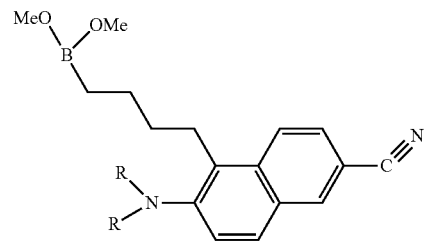

[Chemical Structural Formula (2-9)]

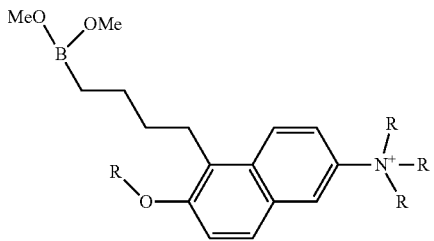

[Chemical Structural Formula (2-10)]

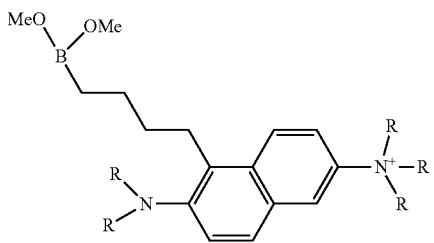

-continued

[Chemical Structural Formula (2-11)]

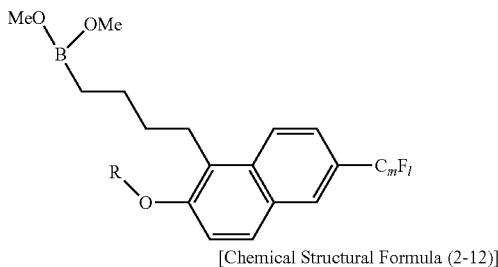

[Chemical Structural Formula (2-12)]

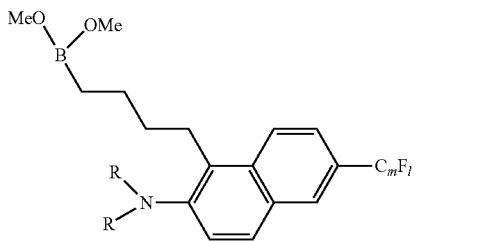

where each R is independently one selected from hydrogen, a $C_1$-$C_6$ alkyl group, a $C_1$-$C_6$ alkenyl group and a $C_1$-$C_6$ alkynyl group, and m and l are each independently an integer of 1 to 10.

The element orienter may include a main chain portion, a linking group bonded to the main chain portion, and a first functional group and a second functional group bonded to the main chain portion.

The main chain portion may include at least one phenyl group, and the first functional group and the second functional group stabilize an intra-molecular dipole formed in the main chain portion.

The first functional group may include an electron donor group, and the second functional group includes an electron withdrawing group.

The linking group may form a covalent bond with an element included in the insulating material film.

The linking group may include a carbon chain including at least one single bond, and the element orienter is oriented in any direction.

The element orienter may be oriented to be parallel to a direction in which the first conductivity type semiconductor, the active layer, and the second conductivity type semiconductor are sequentially stacked.

According to another embodiment of the present disclosure, a display device includes a substrate, at least one first electrode and at least one second electrode extending in a first direction on the substrate and spaced apart from each other in a second direction different from the first direction, at least one light emitting element in a separation space between the first electrode and the second electrode, a first contact electrode partially covering the first electrode and contacting a first end of the light emitting element and a second contact electrode spaced apart from the first contact electrode and partially covering the second electrode to contact a second end opposite to the first end of the light emitting element, wherein the light emitting element includes an element rod and an insulating material layer surrounding an outer peripheral (e.g., circumferential) surface of the element rod, and the insulating material layer includes an insulating material film and an element orienter bonded to an outer peripheral (e.g., circumferential) surface of the insulating material film.

The element rod may include a first conductivity type semiconductor doped to have (e.g., doped with) a first polarity, an active layer on the first conductivity type semiconductor and a second conductivity type semiconductor on the active layer and doped to have (e.g., doped with) a second polarity opposite to the first polarity, wherein the insulating material layer surrounds side surfaces of the first conductivity type semiconductor, the active layer, and the second conductivity type semiconductor.

The light emitting element may be aligned such that the first conductivity type semiconductor, the active layer, and the second conductivity type semiconductor are sequentially formed in a direction parallel to the second direction between the first electrode and the second electrode.

The element orienter may include a main chain portion, a linking group bonded to the main chain portion, and a first functional group and a second functional group substituted in the main chain portion, and the element orienter may be oriented to be substantially parallel to a direction in which the first conductivity type semiconductor, the active layer, and the second conductivity type semiconductor are sequentially formed.

According to an other embodiment of the present disclosure, a method for manufacturing a display device, includes providing a base substrate including a substrate, at least one first electrode and at least one second electrode spaced apart from each other on the substrate, and an insulating layer covering the first electrode and the second electrode, applying a coating solution in which light emitting elements are dispersed onto the first electrode and the second electrode of the base substrate and aligning the light emitting elements between the first electrode and the second electrode by forming an electric field between the first electrode and the second electrode.

The light emitting element may include an element rod and an insulating material layer surrounding an outer peripheral (e.g., circumferential) surface of the element rod, and the insulating material layer may include an insulating material film and an element orienter bonded to an outer peripheral (e.g., circumferential) surface of the insulating material film.

The element rod may include a first conductivity type semiconductor doped to have (e.g., doped with) a first polarity, an active layer on the first conductivity type semiconductor and a second conductivity type semiconductor on the active layer and doped to have (e.g., doped with) a second polarity opposite to the first polarity, wherein in the aligning of the light emitting elements, a dipole in the light emitting element is formed between the first conductivity type semiconductor and the second conductivity type semiconductor.

In the aligning of the light emitting elements, the element orienter may be oriented such that a direction of the dipole in the light emitting element is substantially parallel to a direction of an intra-molecular dipole of the element orienter, and dielectric anisotropy of the light emitting element may be increased.

The light emitting elements may be aligned between the first electrode and the second electrode such that the first conductivity type semiconductor, the active layer, and the second conductivity type semiconductor are sequentially formed in a direction parallel to a direction in which the first electrode and the second electrode are spaced apart from each other.

The above and other features and advantages of embodiments of the present disclosure will become more apparent by describing in more detail embodiments thereof with reference to the attached drawings.

Advantageous Effects

In the light emitting element according to an embodiment, an element orienter capable of forming an intra-molecular dipole is bonded thereto, so that the dielectric anisotropy of the light emitting element can be increased.

In addition, since the dielectric anisotropy of the light emitting element is increased, when the display device is manufactured, the alignment of the light emitting elements can be improved by increasing the dielectrophoretic reactivity when the light emitting elements are aligned between electrodes.

Advantageous effects according to the present disclosure are not limited to those mentioned above, and various other advantageous effects are included herein.

DETAILED DESCRIPTION

Embodiments of the present disclosure will now be described more fully hereinafter with reference to the accompanying drawings, in which embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, embodiments will be described with reference to the accompanying drawings.

Figure 1:
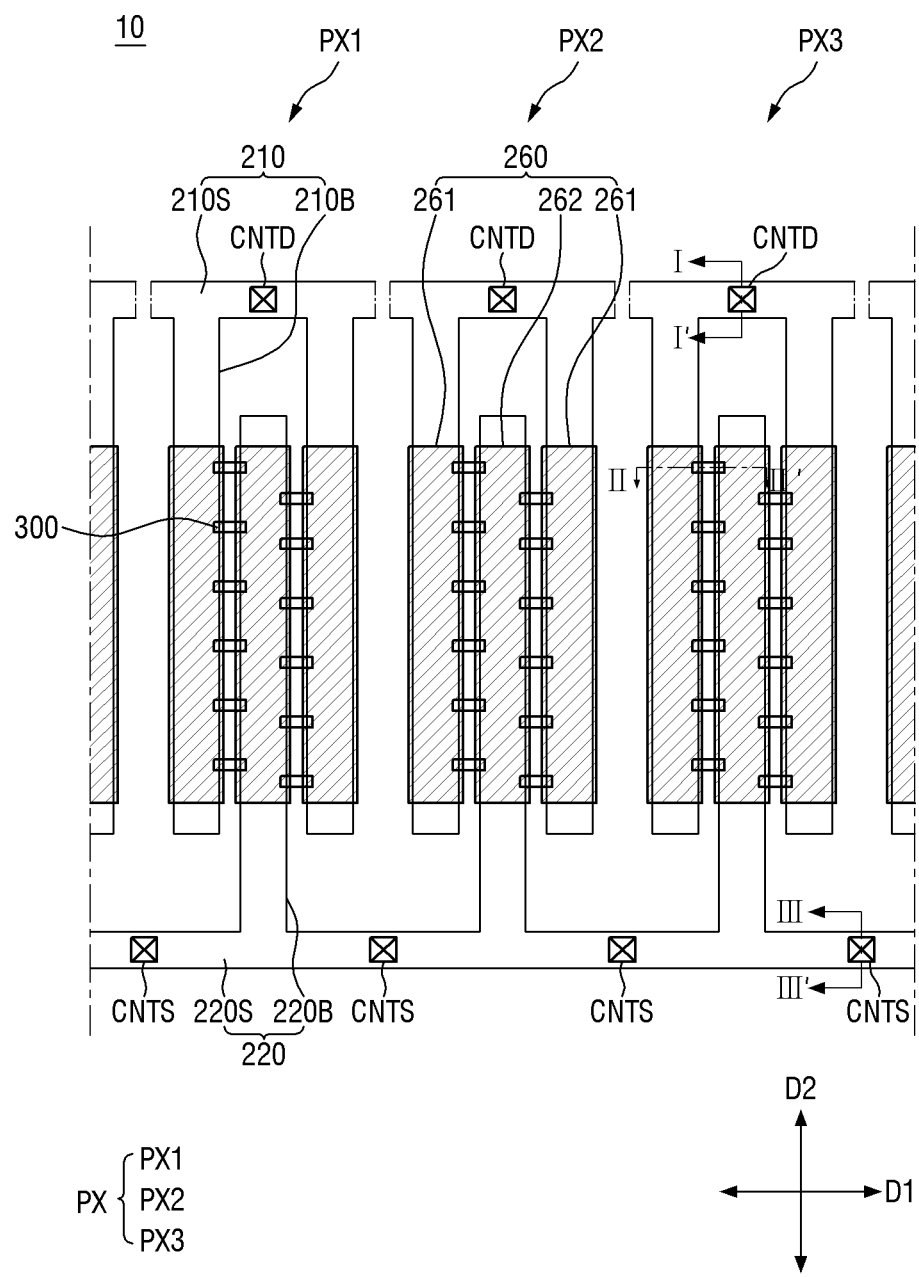
FIG. 1 is a plan view of a display device according to an embodiment.

FIG. 1 is a plan view of a display device according to an embodiment.

The display device 10 may include at least one area defined as a pixel PX. The display device 10 may include a display area composed of a plurality of pixels PX, each emitting light in a specific wavelength band to the outside of the display device 10. Although three pixels PX1, PX2, and PX3 are illustrated in FIG. 1 as examples, it is obvious that the display device 10 may include a larger number of pixels. Although it is shown in the drawing that a plurality of pixels PX are arranged in one direction, e.g., a first direction D1, in a cross-sectional view, the plurality of pixels PX may also be arranged in a second direction D2 crossing the first direction D1. Further, each of the pixels PX of FIG. 1 may be divided into a plurality of portions, and each portion may constitute one pixel PX. The pixels are not necessarily arranged in parallel only in the first direction D1 as shown in FIG. 1, and may have various structures such as being arranged in a vertical direction (or the second direction D2) or in a zigzag manner.

Although not shown in the drawing, the display device 10 may include an emission area in which light emitting elements 300 are arranged for emitting certain color lights and a non-emission area defined as an area remaining after exclusion of the emission area. The non-emission area may be covered by certain members that are not visually perceived from the outside of the display device 10. Various members for driving the light emitting elements 300 in the emission area may be in the non-emission area. For example, the non-emission area may include a wiring, a circuit unit, and a driving unit for applying an electrical signal to the emission area, but the present disclosure is not limited thereto.

The plurality of pixels PX may display colors by including one or more light emitting elements 300 emitting light of a specific wavelength band. The light emitted from the light emitting element 300 may be projected to the outside through the emission area of the display device 10. In an embodiment, each of the pixels PX presenting different colors may include different light emitting elements 300 emitting different color lights. For example, a first pixel PX1 presenting a red color may include a light emitting element 300 emitting a red light, a second pixel PX2 presenting a green color may include a light emitting element 300 emitting a green light, and a third pixel PX1 presenting a blue color may include a light emitting element 300 emitting a blue light. However, the present disclosure is not limited thereto, and the pixels presenting different colors may, in some cases, include the light emitting elements 300 emitting the same color light (e.g., blue light) or they may each include a wavelength conversion layer or a color filter on a light emission path to produce pixel-specific colors. However, the present disclosure is not limited thereto, and adjacent pixels PX may emit the same color light in some cases.

With reference to FIG. 1, the display device 10 may include a plurality of electrodes 210 and 220 and a plurality of light emitting elements 300. At least a portion of each of the electrodes 210 and 220 may be arranged in each pixel PX, and electrically connected to the light emitting elements 300 to apply an electrical signal in order for the light emitting elements 300 to emit a certain color light.

At least a portion of each of the electrodes 210 and 220 may also contribute to producing an electric field in the pixels PX to align the light emitting elements 300. In more detail, it is necessary to precisely align the pixel-specific (PX-specific) light emitting elements 300 during the alignment of the light emitting elements 300 emitting different color lights in the plurality of pixels PX. In the case of using an electrophoresis method for aligning the light emitting elements 300, the light emitting elements 300 may be aligned in such a way of depositing a solution including the light emitting elements 300 on the display device 10 and applying alternating current (AC) power thereto to create a capacitance with an electric field, which produces an electrophoresis force to the light emitting elements 300.

Meanwhile, in the light emitting element 300 according to an embodiment, an insulating material layer 380 (see FIG. 3) surrounding the outer surface thereof may include an insulating material film 381 and an element orienter 385 bonded to the insulating material film 381 and capable of forming an intra-molecular dipole. The element orienter 385 may have an intra-molecular dipole due to a resonance structure, which may increase the dielectric anisotropy of the light emitting element 300. Accordingly, when the light emitting elements 300 are aligned by a dielectrophoretic force, the dielectrophoretic reactivity of the light emitting elements 300 can be improved, and the alignment degree of the light emitting elements 300 between the electrodes 210 and 220 can be improved. A more detailed description thereof will be given below.

The plurality of electrodes 210 and 220 may include a first electrode 210 and a second electrode 220. In an embodiment, the first electrode 210 may be a pixel electrode branched to each pixel PX, and the second electrode 220 may be a common electrode connected in common to the plurality of plurality of pixels PX. One selected from the first and second electrodes 210 and 220 may be an anode electrode of the light emitting element 300 and the other may be a cathode electrode of the light emitting element 300. However, the present disclosure is not limited thereto, and the reverse may also be the case.

The first and second electrodes 210 and 220 may include respective electrode stems 210S and 220S arranged to extend in the first direction D1 and at least one respective electrode branches 210B and 220B extending, in the second direction D2 crossing the first direction D1, from the respective electrode stems 210S and 220S.

In more detail, the first electrode 210 may include a first electrode stem 210S arranged to extend in the first direction D1 and at least one first electrode branch 210B branched from the first electrode stem 210S and extending in the second direction D2. Although not shown in the drawing, the first electrode stem 210S may be connected, at one end thereof, to a signal input pad and extend, at the other end thereof, in the first direction D1 maintaining electrical disconnection between the pixels PX. The signal input pad may be connected to a power source of the display device 10 or the outside to apply an electrical signal or, in the case of aligning the light emitting elements 300, AC power to the first electrode stem 210S.

The first electrode stem 210S of one pixel may be arranged substantially on the same line as the first electrode stem 210S of neighboring pixels belonging to the same row (e.g., adjacent in the first direction D1). That is, the first electrode stem 210S of one pixel may be arranged such that two ends thereof terminate between corresponding pixels while being spaced apart from each other, and the first electrode stems 210S of the neighboring pixels may be aligned with an extension line of the first electrode stem 210S of the one pixel. In this manner, the first electrode stem 210S may be arranged in such a way of being formed as an continuous stem electrode in a manufacturing process and cut off by a laser and/or the like to be open after performing the alignment process of the light emitting elements 300. Accordingly, the first electrode stems 210S of the respective pixel PX may apply different electrical signals to the respective first electrode branches 210B, which may operate independently of each other.

The first electrode branch 210B may be branched from at least part of the first electrode stem 210S and extend in the second direction D2 and terminate to keep a distance from the second electrode stem 220S arranged to face the first electrode stem 210S. That is, the first electrode branch 210B may be arranged to be connected, at one end thereof, to the first electrode stem 210S and placed, at the other end thereof, inside the pixel PX keeping a distance from the second electrode stem 220S. The first electrode branch 210B may be connected to the first electrode stem 210S, which is electrically separate per pixel PX, so as to receive a different electrical signal per pixel PX.

It may also be possible that one or more first electrode branches 210B are arranged per pixel PX. Although it is shown in FIG. 1 that two first electrode branches 210B are arranged and the second electrode branch 220B is arranged therebetween, the present disclosure is not limited thereto, and more first electrode branches 210B may be arranged. In this case, the first electrode branches 210B may be arranged alternately to be separated from the plurality of second electrode branches 220B such that a plurality light emitting elements 300 are arranged therebetween. In some embodiments, the second electrode branch 220B may be arranged between the first electrode branches 210B such that each pixel PX is symmetrical about the second electrode branch 220B. However, the present disclosure is not limited thereto.

The second electrode 220 may include a second electrode stem 220S arranged to extend in the first direction D1 and face the first electrode stem 210S, keeping a distance from the first electrode stem 210S, and at least one second electrode branch 220B branched from the second electrode stem 220S to extend in the second direction D2 and face the first electrode branch 210B, keeping a distance from the first electrode branch 210B. The second electrode stem 220S may also be connected to the signal input pad at one end thereof like the first electrode stem 210S. However, the second electrode stem 220S may extend, at the other end thereof, in the first direction D1 toward the plurality of adjacent pixels PX. That is, the second electrode stem 220S may be electrically continuous between individual pixels PX. Accordingly, the second electrode stem 220S of a certain pixel is connected at opposite ends thereof to one ends of the second electrode stems 220S of the neighboring pixels between the pixels PX to apply the same electrical signal to each pixel PX.

The second electrode branch 220B may be branched from at least part of the second electrode stem 220S and extend in the second direction D2 and terminate to keep a distance from the first electrode stem 210S. That is, the second electrode branch 220B may be arranged to be connected at one end thereof to the second electrode stem 220S and placed at the other end thereof inside the pixel PX keeping a distance from the first electrode stem 210S. The second electrode branch 220B may be connected to the second electrode stem 220S, which is electrically continuous to the respective pixels PX, so as to receive the same electrical signal for each pixel PX.

The second electrode branch 220B may be arranged to face the first electrode branch 210B keeping a distance from the first electrode branch 210B. Here, the first and second electrode stems 210S and 220S face each other about the center of each pixel PX, keeping a distance, such that the first and second electrode branches 210B and 220B extend in the opposite directions. That is, the first electrode branch 210B may extend to one orientation of the second direction D2 and the second electrode branch 220B may extend to the other orientation of the second direction D2 such that one ends of the respective branches are arranged to face opposite orientations about the center of the pixel PX. However, the present disclosure is not limited thereto, and the first and second electrode stems 210S and 220S may be arranged to face the same orientation about the center of the pixel PX keeping a distance from each other. In this case, the first and second electrode branches 210B and 220B branched from the respective electrode stems 210S and 220S may extend in the same direction.

Although it is shown in FIG. 1 that one second electrode branch 220B is arranged in each pixel PX, the present disclosure is not limited thereto, and more second electrode branches 220B may be arranged.

The plurality of light emitting elements 300 may be aligned between the first and second electrode branches 210B and 220B. In more detail, at least part of the plurality of the light emitting elements 300 are each electrically connected at one end thereof to the first electrode branch 210B and at the other end thereof to the second electrode branch 220B.

The plurality of light emitting elements 300 may be aligned in substantially parallel with one another keeping a distance in the second direction D2. The interval between the light emitting elements 300 is not particularly limited. One plurality of light emitting elements 300 may be adjacently arranged to form a cluster while another plurality of light emitting elements 300 may be arranged keeping a predetermined distance from one another to form a cluster, and they may also be aligned to face one orientation at a non-uniform density.

The first and second electrode branches 210B and 220B may have respective contact electrodes 260 arranged thereon.

The plurality of contact electrodes 260 may be arranged to extend in the second direction D2 and spaced apart from one another in the first direction D1. The contact electrodes 260 may each contact at least one end of the light emitting elements 300, and may contact the first and second electrodes 210 and 220 to receive an electrical signal. Accordingly, the contact electrodes 260 may transfer the electrical signal received through the first and second electrodes 220 to the light emitting elements 300.

The contact electrodes 260 may include a first contact electrode 261 and a second contact electrode 262 arranged on the respective electrode branches 210B and 220B to partially cover them and contact respective ends of the light emitting elements 300.

The first contact electrode 261 may be arranged on the first electrode branch 210B to contact ends of the light emitting elements 300 that are electrically connected to the first electrode 210. The second contact electrode 262 may be arranged on the second electrode branch 220B to contact the other ends of the light emitting elements 300 that are electrically connected to the second electrode 220.

In some embodiments, the opposite ends of each of the light emitting elements 300 that are each electrically connected to the first electrode branch 210B or the second electrode branch 220B may be an n-type or p-type doped conductive semiconductor layer. In the case where one end of a light emitting element 300 that is electrically connected to the first electrode branch 210B is a p-type doped conductive semiconductor layer, the other end of the light emitting element 300 that is electrically connected to the second electrode branch 220B may be an n-type doped conductive semiconductor layer. However, the present disclosure is not limited thereto, and an opposite case may also be possible.

The first and second contact electrodes 261 and 262 may be arranged to partially cover the respective first and second electrode branches 210B and 220B. As shown in FIG. 1, the first and second contact electrodes 261 and 262 may be arranged to extend in the second direction D2, face each other and be spaced apart from each other. However, the first and second contact electrodes 261 and 262 may terminate at ends thereof to expose ends of the respective electrode branches 210B and 220B. The first and second contact electrodes 261 and 262 may also terminate at the other ends thereof so as not to overlap the respective electrode stems 210S and 220S in the state of being spaced apart therefrom. However, the present disclosure is not limited thereto, the first and second contact electrodes 261 and 262 may cover the respective electrode branches 210B and 220B.

Meanwhile, as shown in FIG. 1, the first and second electrode stems 210S and 220S may be electrically connected to a thin film transistor 120 or a power wiring 161 (to be described below) via respective contact holes, e.g., a first electrode contact hole CNTD and a second electrode contact hole CNTS. Although it is shown in FIG. 1 that the first and second electrode stems 210S and 220S have each a contact hole arranged thereon per pixel PX, the present disclosure is not limited thereto. Because the second electrode stem 220S may extend to establish an electrical connection with the adjacent pixels PX as described above, the second electrode stem 220S may, in some embodiments, be electrically connected to the thin film transistor via one contact hole.

A description is made hereinafter of the configuration of the plurality of members arranged on the display device 10 in more detail with reference to FIG. 2.

Figure 2:
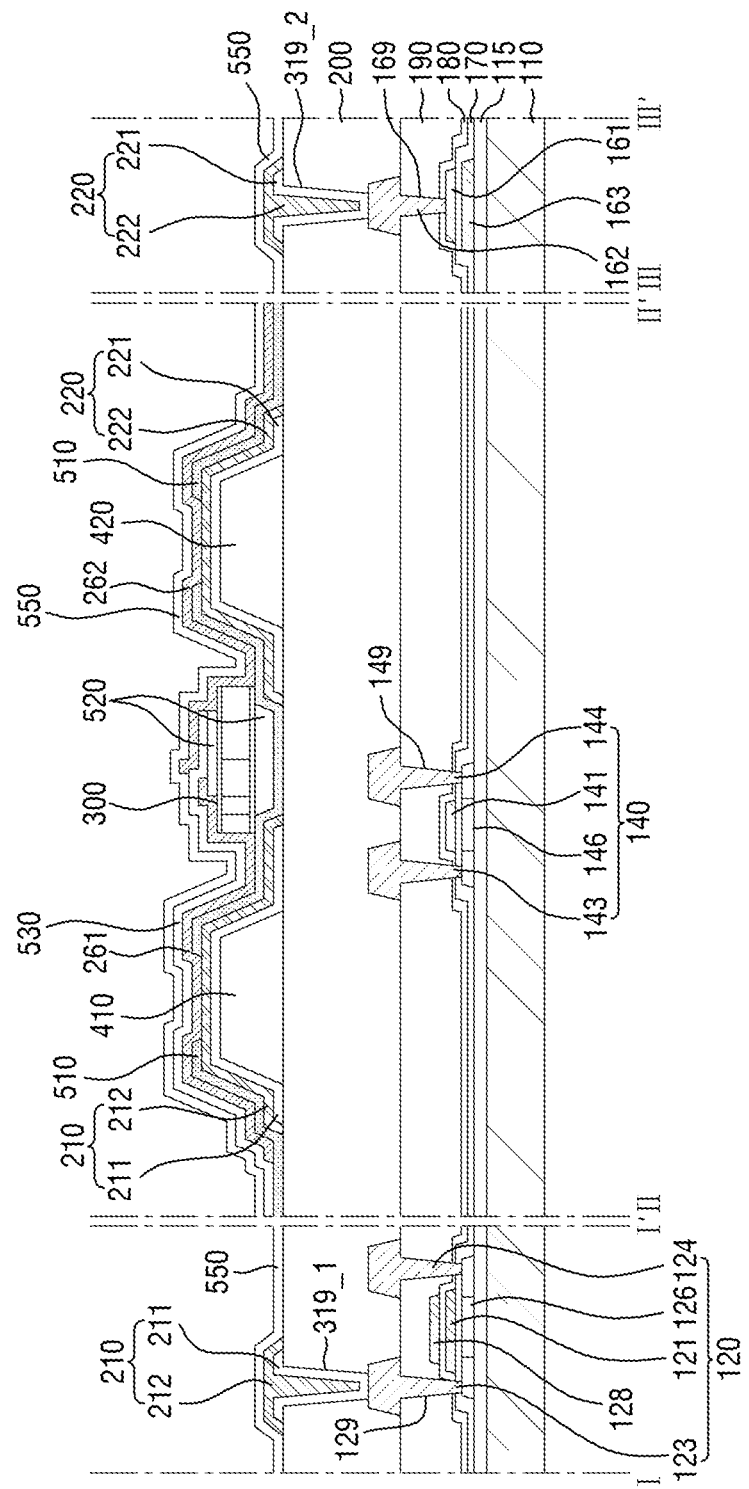
FIG. 2 is a cross-sectional view taken along lines I-I', I-II' and III'-III' of FIG. 1.

FIG. 2 is a cross-sectional view taken along lines I-I', I-II' and III'-III' of FIG. 1. Although FIG. 2 shows a single pixel PX, the configuration may be identically applicable to other pixels. FIG. 2 shows a cross section across one and the other ends of a certain light emitting element 300.

Referring to FIGS. 1 and 2, the display device 10 may include a substrate 110, thin film transistors 120 and 140 on the substrate 110, and the electrodes 210 and 220 on the thin film transistors 120 and 140, and the light emitting elements 300. The thin film transistors may include a first thin film transistor 120 and a second thin film transistor 140, and they may be a driving transistor and a switching transistor, respectively. Each of the thin film transistors 120 and 140 may include an active layer, a gate electrode, a source electrode, and a drain electrode. The first electrode 210 may be electrically connected to the drain electrode of the first thin film transistor 120.

Specifically, the substrate 110 may be an insulating substrate. The substrate 110 may be made of an insulating material such as glass, quartz, and/or polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. Further, the substrate 110 may be a rigid substrate, but may also be a flexible substrate which can be bent, folded or rolled.

A buffer layer 115 may be on the substrate 110. The buffer layer 115 can prevent diffusion of impurity ions, prevent penetration of moisture and/or external air, and perform a surface planarization function. The buffer layer 115 may include silicon nitride, silicon oxide, silicon oxynitride, and/or the like.

A semiconductor layer is on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, oxide semiconductor, and/ or the like.

A first gate insulating layer 170 is on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, and/or the like. These may be used alone or in combination with each other.

A first conductive layer is on the first gate insulating layer 170. The first conductive layer may include a first gate electrode 121 on the first active layer 126 of the first thin film transistor 120, a second gate electrode 141 on the second active layer 146 of the second thin film transistor 140, and a power wiring 161 on the auxiliary layer 163, with the first gate insulating layer 170 interposed therebetween, respectively. The first conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single layer or a multilayer.

A second gate insulating layer 180 is on the first conductive layer. The second gate insulating layer 180 may be an interlayer insulating layer. The second gate insulating layer 180 may be formed of an inorganic insulating material such as silicon oxide, silicon nitride, silicon oxynitride, hafnium oxide, aluminum oxide, titanium oxide, tantalum oxide, zinc oxide and/or the like.

A second conductive layer is on the second gate insulating layer 180. The second conductive layer includes a capacitor electrode 128 disposed on the first gate electrode 121 with the second gate insulating layer 180 interposed therebetween. The capacitor electrode 128 may form a storage capacitor in cooperation with the first gate electrode 121.

In the same way as the first conductive layer described above, the second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

An interlayer insulating layer 190 is on the second conductive layer. The interlayer insulating layer 190 may be an interlayer insulating film. Further, the interlayer insulating layer 190 may perform a surface planarization function. The interlayer insulating layer 190 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

A third conductive layer is on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power electrode 162 on the power wiring 161.

The first source electrode 124 and the first drain electrode 123 may be electrically connected to the first active layer 126 through a first contact hole 129 passing through the interlayer insulating layer 190 and the second gate insulating layer 180. The second source electrode 144 and the second drain electrode 143 may be electrically connected to the second active layer 146 through a second contact hole 149 passing through the interlayer insulating layer 190 and the second gate insulating layer 180. The power electrode 162 may be electrically connected to the power wiring 161 through a third contact hole 169 passing through the interlayer insulating layer 190 and the second gate insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single layer or a multilayer. For example, the third conductive layer may have a stacked structure of Ti/Al/Ti, Mo/Al/Mo, Mo/AlGe/Mo, and/or Ti/Cu.

An insulating substrate layer 200 is on the third conductive layer. The insulating substrate layer 200 may be formed of an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB). The surface of the insulating substrate layer 200 may be flat.

The insulating substrate layer 200 may include a plurality of banks 410 and 420. The plurality of banks 410 and 420 may be arranged to face each other, keeping a distance therebetween, inside each pixel PX, and the distanced banks 410 and 420, e.g., a first bank 410 and a second bank 420, may have the first electrode 210 and the second electrode 220 arranged respectively thereon. As shown in FIG. 1, three banks 410 and 420, i.e., two first banks 410 and one second wall 420 are arranged to be covered by the respective first and second electrodes 210 and 220 within one pixel PX. Although FIG. 2 shows only a cross section of one first bank 410 and one second bank 420 among them, the arrangement configuration thereof may be identically applicable to the other first bank 410 not shown in FIG. 2.

However, the number of banks 410 and 420 is not limited thereto. For example, it may be possible that more banks 410 and 420 are arranged in one pixel PX along with more first and second electrodes 210 and 220. The banks 410 and 420 may include at least one first bank 410 on which the first electrode 210 is arranged and at least one second bank 420 on which the second electrode 220 is arranged. In this case, the first and second banks 410 and 420 may be arranged to face each other and be spaced apart such that the plurality of banks are alternately arranged in one direction. In some embodiments, it may be possible that two first banks 410 are arranged, spaced apart from each other, and one second bank 420 is arranged between the distanced first banks 410.

Furthermore, although not shown in FIG. 2, the first and second electrodes 210 and 220 may include the respective electrode stems 210S and 220S and the respective electrode branches 210B and 220B as described above. It may be understood in FIG. 2 that the first and second electrode branches 210B and 220B are respectively arranged on the first and second banks 410 and 420.

The plurality of banks 410 and 420 may be formed with the substantially same material in a single process. In this case, the banks 410 and 420 may form a grid pattern. The banks 410 and 420 may include polyimide.

Meanwhile, although not shown in the drawing, at least part of the plurality of banks 410 and 420 may be arranged on a boundary of the pixels PX to make them distinct. In this case, the electrodes 210 and 220 may not be on the banks 410 and 420 at the boundary of the pixel PX. Such banks may be arranged in a substantially grid pattern along with the aforementioned first and second banks 410 and 420. At least part of the banks 410 and 420 arranged on the boundary of the pixels PX may be formed to cover electrode lines of the display device 10.

The plurality of banks 410 and 420 may each have a structure protruding at least partially from the insulating substrate layer 200. The banks 410 and 420 may protrude upward from a flat plane on which the light emitting elements 300 are arranged such that a protruded part may at least partially have slopes. The banks 410 and 420 having a protruded structure with slopes may have reflection layers 211 and 221 arranged thereon to reflect incident light. The light directed from the light emitting element 300 to the reflection layers 211 and 221 may be reflected to the outside of the display device 10, i.e., upward from the banks 410 and 420. The banks 410 and 420 with the protruded structure may not be limited in shape. Although it is shown in FIG. 2 that the banks have a shape having a flat top surface and angular corners, the present disclosure is not limited thereto, and the banks may be protruded to have round corners.

The plurality of banks 410 and 420 may have reflection layers 211 and 221 arranged thereon.

The first reflection layer 211 covers the first bank 410 and is partially electrically connected to the first drain electrode 123 of the first thin film transistor 120 via a fourth contact hole 319_1 penetrating the insulating substrate layer 200. The second reflection layer 221 covers the second bank 420 and is partially electrically connected to the power electrode 162 via a fifth contact hole 319_2 penetrating the insulating substrate layer 200.

The first reflection layer 211 may be electrically connected to the first drain electrode 123 of the first thin film transistor 120 via the fourth contact hole 319_1 within the pixel PX. Accordingly, the first thin film transistor 120 may be arranged in an area overlapping the pixel PX. FIG. 1 shows electrical connection to the first thin film transistor 120 via the first electrode contact hole CNTD arranged on the first electrode stem 210S. That is, the first electrode contact hole CNTD may be the fourth contact hole 319_1.

The second reflection layer 221 may also be electrically connected to the power electrode 162 via the fifth contact hole 319_2 within the pixel PX. FIG. 2 shows that the second reflection layer 221 is connected through the fifth contact hole 319_2 within one pixel PX. FIG. 1 shows that the second electrode 220 of each pixel PX is electrically connected to the power wiring 161 via the plurality of second electrode contact holes CNTS on the second electrode stem 220S. That is, the second contact holes CNTS may be the fifth contact hole 319_2.

As described with reference to FIG. 1, the first and second contact holes CNTD and CNTS may be respectively arranged on the first and second electrode stems 210S and 220S. In this respect, FIG. 2 shows that, in the cross-sectional view of the display device 10, the first and second electrodes 210 and 220 are electrically connected to the first thin film transistor 120 or the power wiring 161 via the respective fourth and fifth contact holes 319_1 and 319_2 in an area separated from the banks 410 and 420 on which the first and second electrode branches 210B and 220B are arranged.

However, the present disclosure is not limited thereto. For example, in FIG. 1, the second electrode contact holes CNTS may be arranged at various positions on the second electrode stem 220S and, in some cases, on the second electrode branch 220B. In some embodiments, the second reflection layer 221 may also be connected to one second electrode contact hole CNTS or the fifth contact hole 319_2 in an area out of one pixel PX.

In an area outside the emission area in which the pixels PX of the display device 100, e.g., an outside area of the emission area, there may be a non-emission area in which no light emitting elements 300 are arranged. As described above, the second electrodes 220 of each pixel PX may be electrically connected via the second electrode stem 220S so as to receive the same electrical signal.

In some embodiments, in the case of the second electrode 220, the second electrode stem 220S may be electrically connected to the power electrode 162 via one second electrode contact hole CNTS in the non-emission area as the outside area of the display device 10. Unlike the display device 10 of FIG. 1, because the second electrode stem 220S is arranged to extend to adjacent pixels and be electrically connected to each other even though the second electrode stem 220S is connected to the power electrode 162 via one contact hole, it may be possible to apply the same electrical signal to the second electrode branches 220B of the respective pixels PX. In the case of the second electrode 220 of the display device 10, the position of the contact hole for receiving an electrical signal from the power electrode 162 may vary according to the structure of the display device 10.

Meanwhile, with reference back to FIGS. 1 and 2, the reflection layers 211 and 221 may include a material having high reflectivity for reflecting the light emitted from the light emitting elements 300. For example, the reflection layers 211 and 221 may include, but are not limited to, a material such as silver (Ag) and copper (Cu).

The first and second reflection layers 211 and 221 may include first and second electrode layers 212 and 222 arranged respectively thereon.

The first electrode layer 212 may be arranged directly on the first reflection layer 211. The first electrode layer 212 may have a pattern substantially identical with that of the first reflection layer 211. The second electrode layer 222 may be arranged directly on the second reflection layer 221 to be spaced apart from the first electrode layer 212. The second electrode layer 222 may have a pattern that is substantially identical with that of the second reflection layer 221.

In an embodiment, the electrode layers 212 and 222 may cover the reflection layers 211 and 221 respectively thereebeneath. That is, the electrode layers 212 and 222 may be formed to be larger in size than the reflection layers 211 and 221 to cover the side end surfaces of the reflection layers 211 and 221. However, the present disclosure is not limited thereto.

The first and second electrode layers 212 and 222 may transfer, to contact electrodes 261 and 262 (to be described below), an electrical signal directed to the first and second reflection layers 211 and 221 connected to the first thin film transistor 120 or the power electrode 162. The electrode layers 212 and 222 may include a transparent conductive material. For example, the electrode layers 212 and 222 may include a material such as indium tin oxide (ITO), indium zinc oxide (IZO), and indium tin zinc oxide (ITZO), but are not limited thereto. In some embodiments, the reflective layers 211 and 221 and the electrode layers 212 and 222 may have a structure in which at least one transparent conductive layer such as ITO, IZO, or ITZO and at least one metal layer such as silver (Ag) or copper (Cu) are stacked. For example, the reflective layers 211 and 221 and the electrode layers 212 and 222 may have a stacked structure of ITO/Ag/ITO.

The first reflective layer 211 and the first electrode layer 212 on the first partition wall 410 form the first electrode 210. The first electrode 210 may protrude to regions extending from both ends of the first partition wall 410, and accordingly, the first electrode 210 may contact the insulating substrate layer 200 in the protruding region. The second reflective layer 221 and the second electrode layer 222 on the second partition wall 420 form the second electrode 220. The second electrode 220 may protrude to regions extending from both ends of the second partition wall 420, and accordingly, the second electrode 220 may contact the insulating substrate layer 200 in the protruding region.

The first and second electrodes 210 and 220 may be respectively arranged to cover the entire areas of the first and second banks 410 and 420. However, as described above, the first and second electrodes 210 and 220 are arranged to face each other keeping a distance therebetween. Between the electrodes, a first insulating layer 510, which is to be described below, may be arranged and the light emitting elements 300 may be arranged thereon.

In addition, the first reflective layer 211 may receive a driving voltage from the first thin film transistor 120 and the second reflective layer 221 may receive a source voltage from the power wiring 161. Thus, the first electrode 210 and the second electrode 220 receive the driving voltage and the source voltage, respectively. The first electrode 210 may be electrically connected to the first thin film transistor 120, and the second electrode 220 may be electrically connected to the power wiring 161. Accordingly, the first and second contact electrodes 261 and 262 arranged respectively on the first and second electrodes 210 and 220 may receive the driving voltage and source voltage. The driving voltage and the source voltage may be transferred to the light emitting elements 300 such that the light emitting elements 300 emit light with a predetermined electric current flowing therethrough.

The first insulating layer 510 is arranged to partially cover the first and second electrodes 210 and 220. The first insulating layer 510 may be arranged to mostly cover the top surfaces of the first and second electrodes 210 and 220 and partially expose the first and second electrodes 210 and 220. The first insulating layer 510 may also be arranged in the space between the first and second electrodes 210 and 220. The first insulating layer 510 may have an islet or line shape formed along the space between the first and second electrode branches 210B and 220B in a plan view.

FIG. 2 shows that the first insulating layer 510 is arranged in the space between one first electrode 210 (e.g., first electrode branch 210B) and one second electrode 220 (e.g., second electrode branch 220B). However, as described above, there may be a plurality of the first and second electrodes 210 and 220 such that the first insulating layer 510 may be also arranged between one first electrode 210 and another second electrode 220 or between one second electrode 220 and another first electrode 210. The first insulating layer 510 may be arranged to partially cover the side surfaces of the first and second electrodes 210 and 220 that are opposite to the side surfaces facing each other. That is, the first insulating layer 510 may be arranged to expose center parts of the first and second electrodes 210 and 220.

On the first insulating layer 510, the light emitting element 300 is arranged. The first insulating layer 510 may be arranged between the light emitting element 300 and the insulating substrate layer 200. The first insulating layer 510 may have a bottom surface contacting the insulating substrate layer 200, and the light emitting element 300 may be arranged on the top surface of the first insulating layer 510. The first insulating layer 510 may contact the electrodes 210 and 220 at both side surfaces thereof to electrically insulate the first and second electrodes 210 and 220 from each other.

The first insulating layer 510 may overlap a partial area on the electrodes 210 and 220, e.g., part of the area protruding in a direction in which the first and second electrodes 210 and 220 face each other. The first insulating layer 510 may also be arranged on the areas where the sloping surfaces and flat top surfaces of the banks 410 and 420 overlap the electrodes 210 and 220.

For example, the first insulating layer 510 may cover the end parts protruding in the direction in which the first and second electrodes 210 and 220 face each other. The first insulating layer 510 may contact the insulating substrate layer 200 partially on the bottom surface thereof and may contact the electrodes 210 and 220 partially on the bottom surface thereof and on the side surfaces thereof. Accordingly, the first insulating layer 510 may protect regions overlapping the respective electrodes 210 and 220 and electrically insulate them. Further, the first insulating material layer 510 may prevent a first conductivity type semiconductor 310 and a second conductivity type semiconductor 320 of the light emitting element 300 from directly contacting other members, thereby preventing damage to the light emitting element 300.

However, the present disclosure is not limited thereto, and the first insulating layer 510 may be arranged only on the areas overlapping the sloping side surfaces of the banks 410 and 420 in the areas on the first and second electrodes 210 and 220 in some embodiments. In this case, the bottom surface of the first insulating layer 510 may terminate on the sloping side surfaces of the banks 410 and 420, and the electrodes 210 and 220 arranged on part of the sloping side surfaces of the banks 410 and 420 may be exposed to contact the contact electrodes 260.

The first insulating layer 510 may also be arranged to expose both ends of the light emitting element 300. Accordingly, the contact electrodes 260 may contact the exposed top surfaces of the electrodes 210 and 220 and both ends of the light emitting element 300, and the contact electrode 260 may transfer the electrical signal applied to the first and second electrodes 210 and 220 to the light emitting element 300.

At least one light emitting element 300 may be between the first electrode 210 and the second electrode 220. Although it is shown in FIG. 2 that one light emitting element 300 is arranged between the first and second electrodes 210 and 220, it is apparent that a plurality of light emitting elements 300 may be arranged in a different direction (e.g., second direction D2) in a plan view as shown in FIG. 1.

In more detail, the light emitting element 300 may be electrically connected to the first electrode 210 at one end thereof and the second electrode 220 at the other end thereof. The both ends of the light emitting elements 300 may respectively contact the first and second contact electrodes 261 and 262.

Meanwhile, FIG. 1 exemplifies the case where only the light emitting elements 300 emitting the same color light are arranged in each pixel PX. However, the present disclosure is not limited thereto, and as described above, the light emitting elements 300 emitting light of different colors may be together in one pixel PX.

The light emitting element 300 may be alight emitting diode. The light emitting element 300 may be a nanostructure mostly having a nano-size. The light emitting element 300 may be an inorganic light emitting diode made of an inorganic material. When the light emitting element 300 is an inorganic light emitting diode, a light emitting material having an inorganic crystal structure is between two electrodes facing each other and an electric field is formed in a specific direction in the light emitting material. Then, the inorganic light emitting diode may be aligned between the two electrodes having a specific polarity.

In some embodiments, the light emitting element 300 may have a stacked structure including a first conductivity type semiconductor 310, an element active layer 330, a second conductivity type semiconductor 320, and an electrode material layer 370. The light emitting element 300 may be manufactured by depositing, horizontally, the first conductivity type semiconductor 310, the element active layer 330, and the second conductivity type semiconductor 320, and the electrode material layer 370 in order on the insulating substrate layer 200. That is, the light emitting elements 300 formed by depositing the plurality of layers may be arranged in the widthwise direction parallel with the insulating substrate layer 200. However, the present disclosure is not limited thereto, and the light emitting elements 300 may be manufactured such that the layers are deposited in the reverse order between the first and second electrodes 210 and 220.

The second insulating layer 520 may be arranged to overlap at least part of the light emitting element 300. The second insulating layer 520 may protect the light emitting element 300 and simultaneously fix the light emitting element 300 between the first and second electrodes 210 and 220.

Although it is shown in FIG. 2 that the second insulating layer 520 is arranged only on the top surface of the light emitting element 300 in cross-sectional view, the second insulating layer 520 may be arranged to surround the outer surface of the light emitting element 300. That is, like the first insulating layer 510, the second insulating layer 520 may be arranged to have an islet or line shape extending in the second direction D2 along the space between the first and second electrode branches 210B and 220B in a plan view.

Part of the material of the second insulating layer 520 may also be arranged at the area where the bottom surface of the light emitting element 300 and the first insulating layer 510 overlap each other. That part may be formed when the light emitting element 300 is aligned on the first insulation layer 510 and then the second insulating layer 520 is disposed thereon during the manufacture of the display device 10. That part may also be formed by the second insulation layer 520 partially permeating, during the formation of the second insulation layer 520, into pores formed in a section of the first insulating layer 510 contacting the bottom surface of the light emitting element 300.

The second insulating layer 520 may be arranged to expose both end surfaces of the light emitting element 300. That is, in cross-sectional view, the second insulating layer 520 arranged on the top surface of the light emitting element 300 is shorter in length measured in an axis direction than the light emitting element 300 such that the second insulating layer 520 may be contracted inward in comparison with the both ends of the light emitting element 300. Accordingly, the first insulating layer 510, the light emitting element 300, and the second insulating layer 520 may be deposited such that the side surfaces thereof are aligned in a stepwise manner. This may facilitate contact between the contact electrodes 261 and 262 and both end surfaces of the light emitting element 300. However, the present disclosure is not limited thereto. The second insulating layer 520 and the light emitting element 300 may have the same length, and both sides thereof may be aligned.

Meanwhile, the second insulating layer 520 may be formed in such away of depositing the corresponding material on the first insulating layer 510 and patterning the corresponding material in an area, e.g., area exposed for contact of the light emitting element 300 to the contact electrode 260. Patterning the second insulating layer 520 may be performed with a conventional dry etching or wet etching process. Here, the first and second insulating layers 510 and 520 may include materials having different etch selectivity to prevent the first insulating layer 510 from being patterned. That is, the first insulating layer 510 may serve as an etching stopper in patterning the second insulating layer 520.

Accordingly, the first insulating layer 510 may not undergo material damage even when the second insulating layer 520 covering the outer surface of the light emitting element 300 is patterned to expose the both ends of the light emitting element 300. In particular, the first insulating layer 510 and the light emitting element 300 may have smooth contact surfaces at the both ends of the light emitting element 300 where the light emitting element 300 and the contact electrode 260 contact each other.

On the second insulating layer 520, the first contact electrode 261 on the first electrode 310 and overlapping at least part of the second insulating layer 520 and the second contact electrode 262 on the second electrode 220 and overlapping at least part of the second insulating layer 520 may be arranged.

The first and second contact electrodes 261 and 262 may be respectively arranged on the top surfaces of the first and second electrodes 210 and 220. In more detail, the first and second contact electrodes 261 and 262 may respectively contact the first and second electrode layers 212 and 222 in the area where the first insulating layer 510 is patterned to expose parts of the first and second electrodes 210 and 220. The first and second contact electrodes 261 and 262 may contact one end side of the light emitting element 300, e.g., the first conductivity type semiconductor 310, the second conductivity type semiconductor 320, or the electrode material layer 370. Accordingly, the first and second contact electrodes 261 and 262 may transfer the electrical signal applied to the first and second electrode layers 212 and 222 to the light emitting element 300.

The first contact electrode 261 may be arranged on the first electrode 210 to cover the first electrode 210 in part and contact the light emitting element 300 and the first and second insulating layers 510 and 520 in part on the bottom surface thereof. One end of the first contact electrode 261 that is oriented to the second contact electrode 262 is arranged on the second insulating layer 520. The second contact electrode 262 may be arranged on the second electrode 220 to cover the second electrode 220 in part and contact the light emitting element 300 and the first and third insulating layers 510 and 530 in part on the bottom surface thereof. One end of the second contact electrode 262 that is oriented to the first contact electrode 261 is arranged on the third insulating layer 530.

The first and second insulating layers 510 and 520 may be patterned into an area to cover the first and second electrode 210 and 220 on the top surface of the first and second banks 410 and 420. Accordingly, the first and second electrode layers 212 and 222 of the respective first and second electrodes 210 and 220 may be exposed to be electrically connected to the respective contact electrodes 261 and 262.

The first contact electrode 261 and the second contact electrode 262 may be spaced apart from each other on the second insulating layer 520 or the third insulating layer 530. That is, the first and second contact electrode 261 and 262 may be arranged to contact the light emitting element 300 and the second insulating layer 520 or the third insulating layers 530 together and, on the second insulating layer 520, to be spaced apart in the deposition direction for electrical insulation. Accordingly, the first and second contact electrodes 261 and 262 may respectively receive different powers from the first thin film transistor 120 and the power wiring 161. For example, the first contact electrode 261 may receive a driving voltage applied from the first thin film transistor 120 to the first electrode 210, and the second contact electrode 262 may receive a common source voltage applied from the power wiring 161 to the second electrode 220. However, the present disclosure is not limited thereto.

The contact electrodes 261 and 262 may include a conductive material. For example, they may include ITO, IZO, ITZO, aluminum (Al), and/or the like. However, the present disclosure is not limited thereto.

Further, the contact electrodes 261 and 262 may include the same material as the electrode layers 212 and 222. The contact electrodes 261 and 262 may be arranged to have substantially the same pattern on the electrode layers 212 and 222 to contact the electrode layers 212 and 222. For example, the first and second contact electrodes 261 and 262 contacting the first and second electrodes 212 and 222 may transfer the electrical signals applied to the first and second electrode layers 212 and 222 to the light emitting element 300.

The third insulating layer 530 may be arranged on the first contact electrode 261 to electrically insulate the first and second contact electrodes 261 and 262 from each other. The third insulating layer 530 may be arranged to cover the first contact electrode 261 and not to overlap an area of the light emitting element 300 such that the light emitting element 300 contacts the second contact electrode 262. The third insulating layer 530 may partially contact the first contact electrode 261, the second contact electrode 262, and the second insulating layer 520 on the top surface of the second insulating layer 520. The third insulating layer 530 may be cover one end of the first contact electrode 261 on the top surface of the second insulating layer 520. Accordingly, the third insulating layer 530 may protect the first contact electrode 361 and electrically insulate the first contact electrode 261 from the second contact electrode 262.

One end of the third insulating layer 530 that is oriented to the second electrode 220 may be aligned with one side surface of the second insulating layer 520.

Meanwhile, in some embodiments, the third insulating layer 530 may be omitted in the display device 10. Accordingly, the first contact electrode 261 and the second contact electrode 262 may be on substantially the same plane, and may be electrically insulated from each other by a passivation layer 550 to be described below.

The passivation layer 550 may be formed on the third insulating layer 530 and the second contact electrode 262 to protect members on the insulating substrate layer 200 against the external environment. When the first contact electrode 261 and the second contact electrode 262 are exposed, a problem of disconnection of the contact electrode material may occur due to electrode damage, so it is required to cover them with the passivation layer 550. That is, the passivation layer 550 may cover the first electrode 210, the second electrode 220, the light emitting element 300, and/or the like. In addition, as described above, when the third insulating layer 530 is omitted, the passivation layer 550 may be formed on the first contact electrode 261 and the second contact electrode 262. In this case, the passivation layer 550 may electrically insulate the first contact electrode 261 and the second contact electrode 262 from each other.

Each of the above-described first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include a material such as silicon oxide (SiOx), silicon nitride (SiNx), silicon oxynitride (SiOxNy), aluminum oxide ($Al_2O_3$), aluminum nitride (AlN), and/or the like. The first insulating layer 510, the second insulating layer 520, the third insulating layer 530, and the passivation layer 550 may be made of the same material, but may also be made of different materials. In addition, various materials that impart insulating properties to the first insulating layer 510, the second insulating layer 520, the third insulating layer 530, and the passivation layer 550 are applicable.

Meanwhile, the first and second insulating layers 510 and 520 may have different in etch selectivity as described above. As one example, when the first insulating layer 510 includes silicon oxide (SiOx), the second insulating layer 520 may include silicon nitride (SiNx). As another example, when the first insulating layer 510 includes silicon nitride (SiNx), the second insulating layer 520 may include silicon oxide (SiOx). However, the present disclosure is not limited thereto.

Meanwhile, the light emitting element 300 may be manufactured on a substrate by epitaxial growth. A seed crystal layer for forming a semiconductor layer may be formed on the substrate, and a desired semiconductor material may be deposited to grow. Hereinafter, the structure of the light emitting element 300 according to various embodiments will be described in more detail with reference to FIG. 3.

Figure 3:
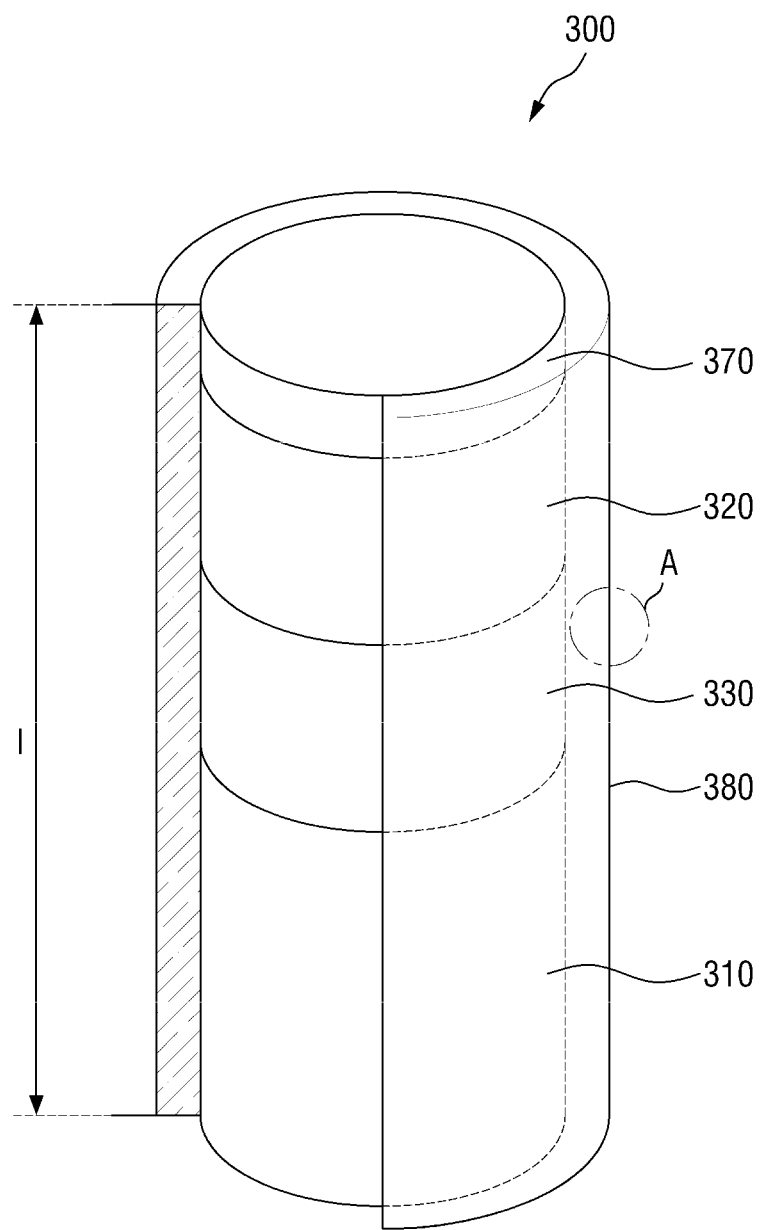
FIG. 3 is a schematic view of a light emitting element according to an embodiment.
Figure 4:
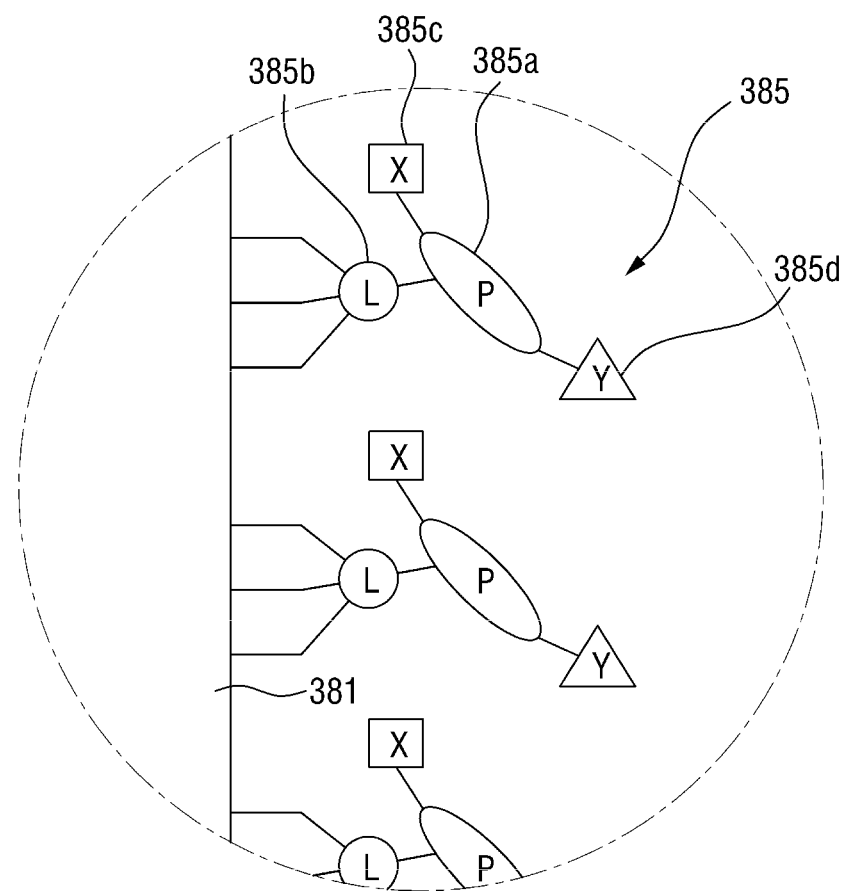
FIG. 4 is an enlarged view of portion A of FIG. 3.

FIG. 3 is a schematic view of a light emitting element according to an embodiment. FIG. 4 is an enlarged view of portion A of FIG. 3.

Referring to FIG. 3, the light emitting element 300 may include a plurality of conductivity type semiconductors 310 and 320, an element active layer 330, an electrode material layer 370, and an insulating material layer 380. The electrical signal received through the first and second electrodes 210 and 220 may be transferred to the element active layer 330 via the plurality of conductivity type semiconductors 310 and 320 to emit light.

In more detail, the light emitting element 300 may include the first conductivity type semiconductor 310, the second conductivity type semiconductor 320, the element active layer 330 arranged between the first and second conductivity type semiconductors 310 and 320, the electrode material layer 370 arranged on the second conductivity type semiconductor 320, and the insulating material layer 380 may surround outer peripheral (e.g., circumferential) surfaces thereof. Although it is shown in FIG. 3 that the light emitting element 300 has a layered structure in which the first conductivity type semiconductor 310, the element active layer 330, the second conductivity type semiconductor 320, and the electrode material layer 370 are deposited in order in the lengthwise direction thereof, the present disclosure is not limited thereto. The electrode material layer 370 may be omitted and, in some embodiments, it may be arranged on at least one selected from both side surfaces of each of the first and second conductivity type semiconductor 310 and 320. Hereinafter, a description is made of an embodiment of the light emitting element 300 of FIG. 3, and it is clear that the following description of the light emitting element 300 is identically applicable to light emitting elements 300 including different structures.

The first conductivity type semiconductor 310 may be an n-type semiconductor layer. As one example, when the light emitting element 300 emits light of a blue wavelength band, the first conductivity type semiconductor 310 may include a semiconductor material having a chemical formula of $In_xAl_yGa_{1-x-y}N$ ($0≤x≤1$, $0≤y≤1$, $0≤x+y≤1$). For example, it may be any one or more of n-type doped InAlGaN, GaN, AlGaN, InGaN, AlN and/or InN. The first conductivity type semiconductor 310 may be doped to have (e.g., doped with) a first conductive dopant. For example, the first conductive dopant may be Si, Ge, Sn, and/or the like. The length of the first conductivity type semiconductor 310 may have a range of 1.5 μm to 5 μm, but is not limited thereto.

The second conductivity type semiconductor 320 may be a p-type semiconductor layer. As one example, when the light emitting element 300 emits light of a blue wavelength band, the second conductivity type semiconductor 320 may include a semiconductor material having a chemical formula of $In_xAl_yGa_{1-x-y}N$ ($0≤x≤1$, $0≤y≤1$, $0≤x+y≤1$). For example, it may be any one or more of p-type doped InAlGaN, GaN, AlGaN, InGaN, AlN and/or InN. The second conductivity type semiconductor 320 may be doped to have (e.g., doped with) a second conductive dopant. For example, the second conductive dopant may be Mg, Zn, Ca, Se, Ba, and/or the like. The length of the second conductivity type semiconductor 320 may have a range of 0.08 μm to 0.25 μm, but is not limited thereto.

The element active layer 330 is between the first conductivity type semiconductor 310 and the second conductivity type semiconductor 320, and may include a material having a single or multiple quantum well structure. When the element active layer 330 includes a material having a multiple quantum well structure, a plurality of quantum layers and well layers may be stacked alternately. The element active layer 330 may emit light by coupling of electron-hole pairs according to an electric signal applied through the first conductivity type semiconductor 310 and the second conductivity type semiconductor 320. For example, when the element active layer 330 emits light of a blue wavelength band, it may include a material such as AlGaN and/or AlInGaN. In particular, when the element active layer 330 has a multiple quantum well structure in which quantum layers and well layers may be stacked alternately, the quantum layer may include a material such as AlGaN and/or AlInGaN, and the well layer may include a material such as GaN and/or AlGaN. However, the present disclosure is not limited thereto, and the element active layer 330 may have a structure in which semiconductor materials having large band gap energy and semiconductor materials having small band gap energy are alternately stacked, and may include other Group III to V semiconductor materials according to the wavelength band of the emitted light. The light emitted by the element active layer 330 is not limited to light of a blue wavelength band, but may also emit light of a red or green wavelength band in some cases. The length of the element active layer 330 may have a range of 0.05 μm to 0.25 μm, but is not limited thereto.

The light emitted from the element active layer 330 may be projected through both side surfaces as well as the outer surface of the light emitting element 300 in a longitudinal direction. The directionality of light emitted from the element active layer 330 is not limited to one direction.

The electrode material layer 370 may be an ohmic contact electrode. However, the present disclosure is not limited thereto, and the electrode material layer 370 may be a Schottky contact electrode. The electrode material layer 370 may include a conductive metal. For example, the electrode material layer 370 may include at least one selected from aluminum (Al), titanium (Ti), indium (In), gold (Au), and silver (Ag). The electrode material layer 370 may include the same material or different materials. However, the present disclosure is not limited thereto.

The insulating material layer 380 may be formed on the outside of the first conductivity type semiconductor 310, the second conductivity type semiconductor 320, the element active layer 330, and the electrode material layer 370, and may function to protect them. For example, the insulating material layer 380 may be formed to surround the side surfaces of the above-mentioned members, and may not be formed at both ends of the light emitting element 300 in the longitudinal direction, e.g., at both ends where the first conductivity type semiconductor 310 and the electrode material layer 370 are located. However, the present disclosure is not limited thereto.

Although it is illustrated in the drawing that the insulating material layer 380 is formed to extend in the longitudinal direction to cover the first conductivity type semiconductor 310 to the electrode material layer 370, the present disclosure is not limited thereto. The insulating material layer 380 may cover only the first conductivity type semiconductor 310, the element active layer 330, and the second conductivity type semiconductor 320 or only part of the outer surface of the electrode material layer 370 and expose part of the outer surface of the electrode material layer 370.

The thickness of the insulating material layer 380 may have a range of 0.5 μm to 1.5 μm, but is not limited thereto.

The insulating material layer 380 may include the insulating material film 381 and the element orienter 385 coupled to the insulating material film 381. The insulating material film 381 has an insulating property, and may perform a function of protecting the first conductivity type semiconductor 310, the second conductivity type semiconductor 320, the element active layer 330, and the electrode material layer 370.

The insulating material film 381 may include materials having insulating properties, for example, silicon oxide (SiOx), silicon nitride (SiNx), silicon oxynitride (SiOxNy), aluminum nitride (AlN), aluminum oxide ($A_2O_3$), and/or the like. Accordingly, an electrical short circuit that may occur when the element active layer 330 directly contacts the first electrode 210 or the second electrode 220 can be prevented. Furthermore, the insulating material film 381 includes the element active layer 330 to protect the outer peripheral (e.g., circumferential) surface of the light emitting element 300, which may prevent degradation in light emission efficiency.

In addition, the insulating material film 381 has an outer peripheral (e.g., circumferential) surface which is surface-treated, and the element orienter 385 may be coupled to at least a portion of the surface thereof. The element orienter 385 may have an intra-molecular dipole due to a resonance structure, which may increase the dielectric anisotropy of the light emitting element 300.

According to an embodiment, the element orienter 385 may have the following structural formula (1).

[Structural Formula (1)]

In structural formula (1), P is a main chain portion 385a that may have a resonance structure and includes at least one phenyl group, L is a linking group 385b that is connected to the main chain portion 385a and may be bonded to the surface of the insulating material film 381, and X and Y are a first functional group 385c and a second functional group 385d that are connected to the main chain portion 385a, and capable of forming an intra-molecular dipole of the main chain portion 385a by stabilizing charges that may be formed by the resonance structure of the main chain portion 385a.

Specifically, the main chain portion 385a may have a resonance structure, and intra-molecular charges may be formed by the resonance structure. The charges can be stabilized by the first functional group 385c and the second functional group 385d, which will be described below, so that the main chain portion 385a can form an intra-molecular dipole. Due to the intra-molecular dipole formed by the main chain portion 385a, the element orienter 385 may increase the dielectric anisotropy of the light emitting element 300, and when the light emitting elements 300 are aligned between the electrodes 210 and 220, the dielectrophoretic reactivity increases, so that the alignment degree can be improved.

The main chain portion 385a is not particularly limited as long as it has a structure capable of increasing the dielectric anisotropy of the light emitting element 300 by forming an intra-molecular dipole by the resonance structure. In an embodiment, the main chain portion 385a may have a structure including at least one phenyl group, and specifically, the main chain portion 385a may be a phenyl group, a biphenyl group, a naphthalene group, and/or the like.

The linking group 385b may be connected to the main chain portion 385a to form a covalent bond with an element present on the surface of the insulating material film 381. The linking group 385b may include a bonding portion forming a covalent bond with the insulating material film 381 and a linking portion connecting the bonding portion to the main chain portion 385a.

In an embodiment, the insulating material film 381 may include a material such as aluminum oxide ($Al_2O_3$) and/or silicon oxide (SiOx), and the linking group 385b may include a silane group and/or a boronic acid group as the bonding portion. Since the silane group and the boronic acid group can form a covalent bond with an oxygen atom (O) present on the surface of the insulating material film 381, the element orienter 385 may be bonded to the insulating material film 381 by the linking group 385b.

In addition, the linking group 385b may include an alkyl group, an alkenyl group, or an alkynyl group having 1 to 6 carbon atoms, as the linking portion. In other words, the linking group 385b may include a carbon chain having a single bond as the linking portion. The carbon chain having a single bond is capable of single bond rotation, so that the element orienter 385 bonded to the linking group 385b may be oriented in a random direction. However, as will be described below, the element orienters 385 may be oriented in the same direction by the capacitance formed by the electric field of the AC power when the light emitting elements 300 are aligned. The element orienters 385 may rotate to be oriented in the same direction by the single bond of the linking group 385b. A more detailed description will be given below.

The first functional group 385c and the second functional group 385d may be bonded to the main chain portion 385a, thereby stabilizing the intra-molecular charges that may be formed by the resonance structure of the main chain portion 385a. In the resonance structure of the main chain portion 385a, the charge density may increase in any region of the molecule to exhibit a negative charge, and on the contrary, the charge density may decrease in other regions to exhibit a positive charge. The first functional group 385c and the second functional group 385d may stabilize the negative and positive charges formed in the resonance structure of the main chain portion 385a. Accordingly, the resonance structure of the main chain portion 385a in which intra-molecular charges are formed may be stabilized, and the element orienter 385 may form an intra-molecular dipole.

In an embodiment, one selected from the first functional group 385c and the second functional group 385d may be an electron donor group (EDG) and the other may be an electron withdrawing group (EWG). As described above, the intra-molecular charges formed by the resonance structure of the main chain portion 385a can be stabilized by the electron donor group (EDG) and the electron withdrawing group (EWG). For example, when the first functional group 385c connected to the main chain portion 385a is the electron donor group (EDG), and the second functional group 385d is the electron withdrawing group (EWG), in the resonance structure of the main chain portion 385a, the region exhibiting a positive charge due to a low charge density may be stabilized by the first functional group 385c, and the region exhibiting a negative charge due to a high charge density may be stabilized by the second functional group 385d. However, the present disclosure is not limited thereto, and the first functional group 385c may be the electron withdrawing group (EWG), the second functional group 385d may be the electron donor group (EDG), and in some cases, the first functional group 385c and the second functional group 385d may contribute to the resonance structure of the main chain portion 385a.

Meanwhile, the element orienter 385 may include an organic ligand capable of forming an intra-molecular dipole by the resonance structure. The organic ligand included in the element orienter 385 may be bonded to the insulating material film 381 of the light emitting element 300 to improve the dielectric anisotropy of the light emitting element 300.

According to an embodiment, the element orienter 385 may include a compound represented by the following chemical structural formula (1).

[Chemical Structural Formula (1)]

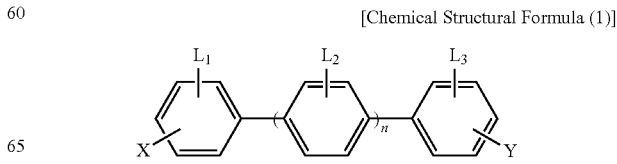

In the chemical structural formula (1), X is —OR or —NR$_2$, Y is one selected from —NR$_3{}^+$, —C$_m$F$_l$ and —CN, at least one selected from L$_1$, L$_2$ and L$_3$ is one selected from —Si(OH)$_3$, —Si(OR)$_3$, —(R)Si(OH)$_3$, —(R)Si(OR)$_3$, —B(OH)$_2$, —B(OR)$_2$, —(R)B(OH)$_2$ and —(R)B(OR)$_2$, the other is hydrogen (H), each R is independently one selected from hydrogen, a C$_1$-C$_6$ alkyl group, a C$_1$-C$_6$ alkenyl group and a C$_1$-C$_6$ alkynyl group, n is an integer of 0 to 3, and m and l may each independently be an integer of 1 to 10.

Further, in an embodiment, the element orienter 385 may include at least one of compounds represented by the following chemical structural formulas (1-1) to (1-12).

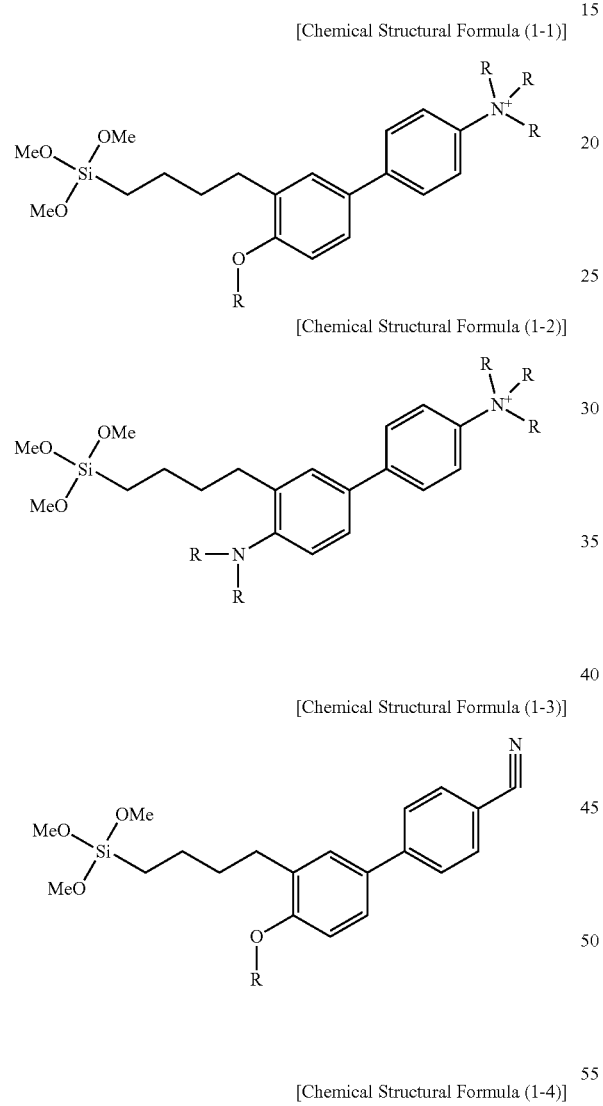

[Chemical Structural Formula (1-1)]

[Chemical Structural Formula (1-2)]

[Chemical Structural Formula (1-3)]

[Chemical Structural Formula (1-4)]

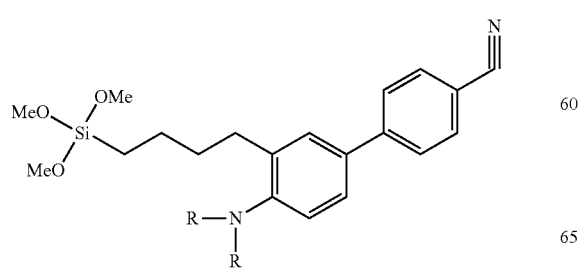

[Chemical Structural Formula (1-5)]

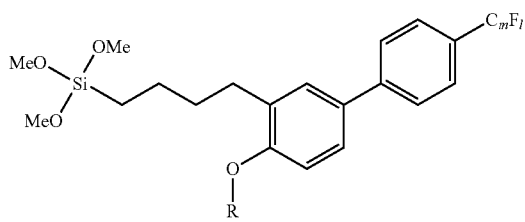

[Chemical Structural Formula (1-6)]

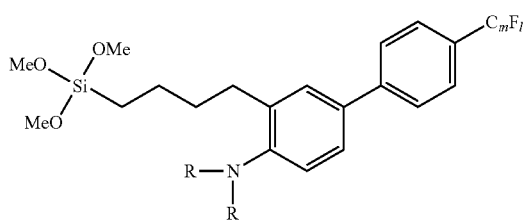

[Chemical Structural Formula (1-7)]

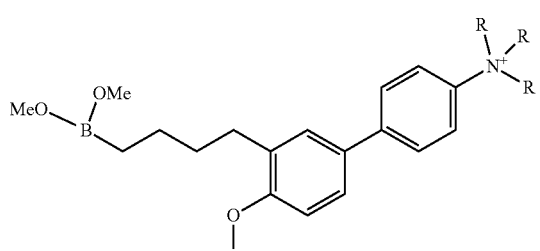

[Chemical Structural Formula (1-8)]

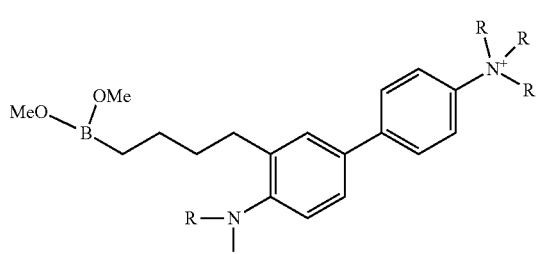

[Chemical Structural Formula (1-9)]

[Chemical Structural Formula (1-10)]

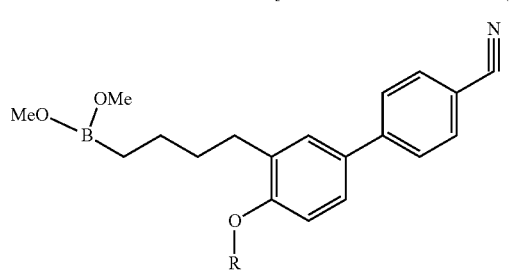

[Chemical Structural Formula (1-11)]

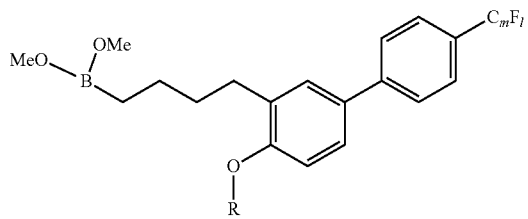

[Chemical Structural Formula (1-12)]

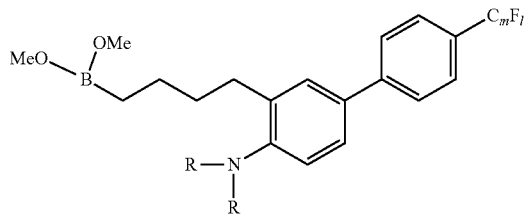

In the chemical structural formulas (1-1) to (1-12), each R is independently one selected from hydrogen, a $C_1$-$C_6$ alkyl group, a $C_1$-$C_6$ alkenyl group and a $C_1$-$C_6$ alkynyl group, and m and l may each independently be an integer of 1 to 10.

Meanwhile, according to an embodiment, the element orienter 385 may include at least one compound represented by the following chemical structural formula (2).

[Chemical Structural Formula (2)]

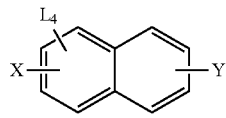

In the chemical structural formula (2), X is —OR or —$NR_2$, Y is one selected from —$NR_3^+$, —$C_mF_l$ and —CN, $L_4$ is one selected from —$Si(OH)_3$, —$Si(OR)_3$, —(R)Si(OH)$_3$, —(R)Si(OR)$_3$, —$B(OH)_2$, —$B(OR)_2$, —(R)$B(OH)_2$ and —(R)$B(OR)_2$, each R is independently one selected from hydrogen, a $C_1$-$C_6$ alkyl group, a $C_1$-$C_6$ alkenyl group and a $C_1$-$C_6$ alkynyl group, and m and l may each be an integer of 1 to 5.

Further, in an embodiment, the element orienter 385 may include at least one of compounds represented by the following chemical structural formulas (2-1) to (2-12).

[Chemical Structural Formula (2-1)]

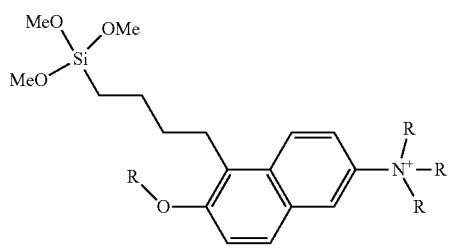

[Chemical Structural Formula (2-2)]

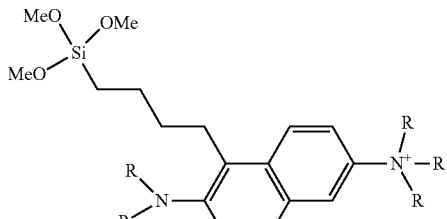

[Chemical Structural Formula (2-3)]

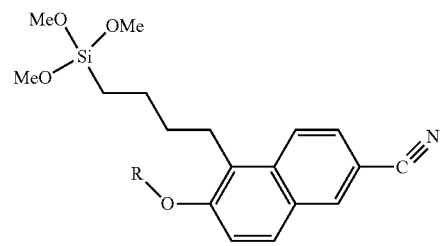

[Chemical Structural Formula (2-4)]

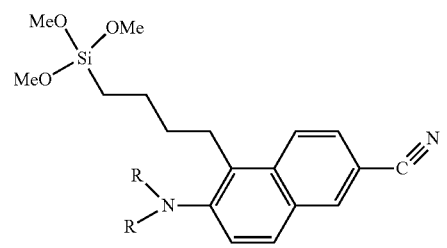

[Chemical Structural Formula (2-5)]

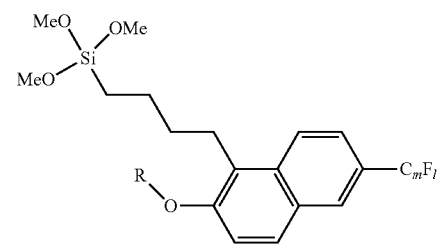

[Chemical Structural Formula (2-6)]

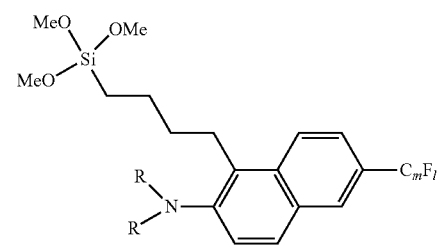

[Chemical Structural Formula (2-7)]

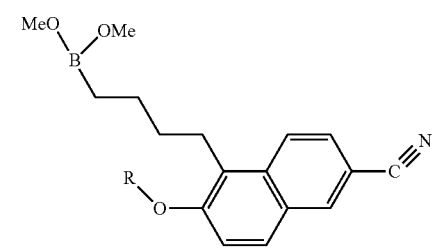

[Chemical Structural Formula (2-8)]

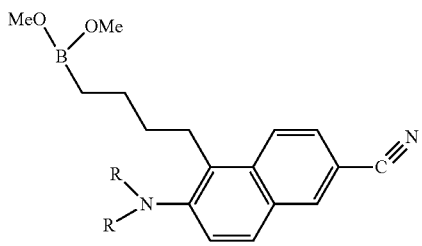

[Chemical Structural Formula (2-9)]

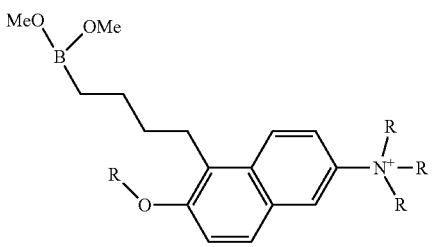

[Chemical Structural Formula (2-10)]

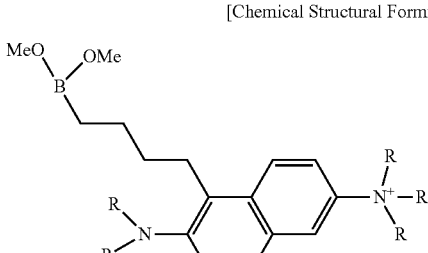

[Chemical Structural Formula (2-11)]

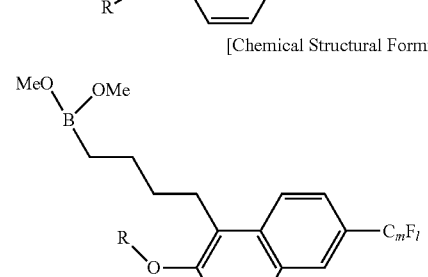

[Chemical Structural Formula (2-12)]

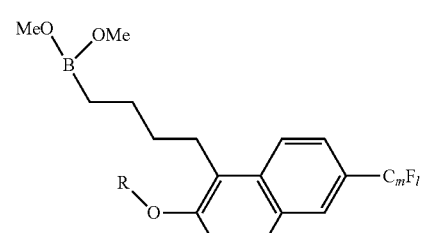

In the chemical structural formulas (2-1) to (2-12), each R is independently one selected from hydrogen, a $C_1$-$C_6$ alkyl group, a $C_1$-$C_6$ alkenyl group and a $C_1$-$C_6$ alkynyl group, and m and l may each independently be an integer of 1 to 10.

Figure 5:
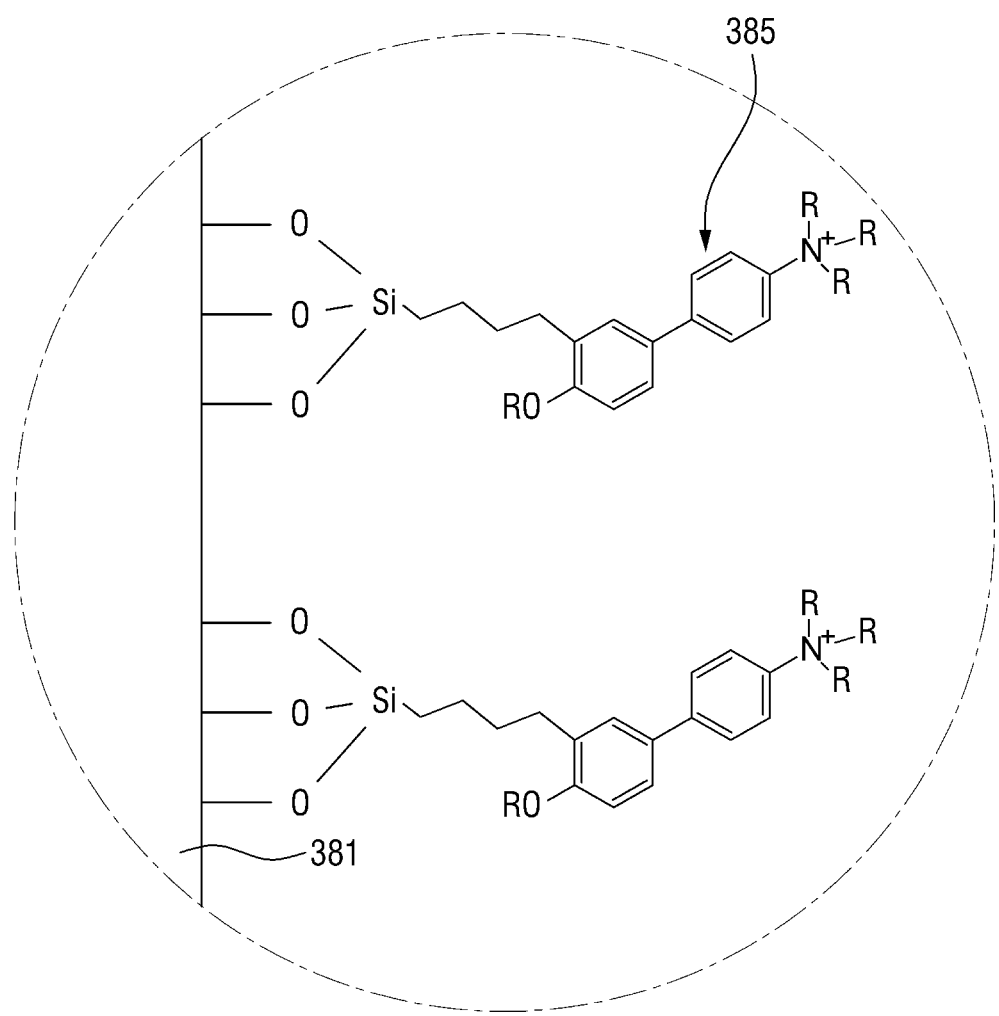
FIG. 5 is an enlarged schematic view of an outer surface of a light emitting element according to an embodiment.

FIG. 5 is an enlarged schematic view of an outer surface of a light emitting element according to an embodiment.

Referring to FIG. 5, as an example, when the element orienter 385 includes the compound represented by the chemical structural formula (1-1), and the insulating material film 381 includes aluminum oxide ($Al_2O_3$), it can be seen that {—$C_4H_9Si(OMe)_3$}, which is the linking group 385b of the element orienter 385, combines with the oxygen atom of aluminum oxide to form {—(O)$_3$Si—$C_4H_9$—}. In addition, it can be seen that the main chain portion 385a includes a biphenyl group, an —OR group acting as an electron donor group is substituted for the first functional group 385c and an —$NR_3^+$ group acting as an electron withdrawing group is substituted for the second functional group 385d in each phenyl group.

As shown in FIG. 5, in the element orienter 385 of the chemical structural formula (1-1), the main chain portion 385a, the first functional group 385c, and the second functional group 385d may form a resonance structure as in the following chemical formula (1).

[Chemical Formula (1)]

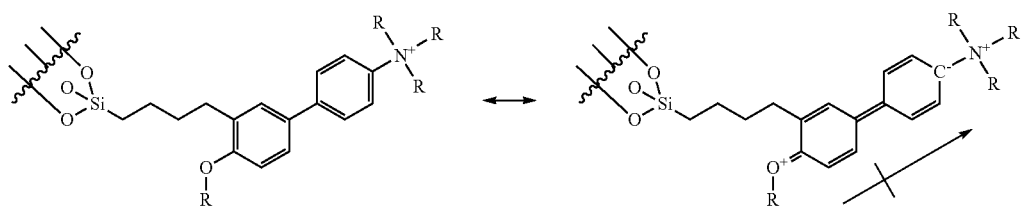

Referring to the chemical formula (1), the biphenyl group of the main chain portion 385a, the —OR group of the first functional group 385c, and the —$NR_3^+$ group of the second functional group 385d may form a resonance structure, and the element orienter 385 may have intra-molecular charges. The first functional group 385c and the second functional group 385d may contribute to the resonance structure of the main chain portion 385a, and stabilize the formed charges to form an intra-molecular dipole.

The element orienter 385 may be formed such that the direction of the intra-molecular dipole formed in the main chain portion 385a is substantially parallel to a first axial direction crossing the first functional group 385c and the second functional group 385d. In this case, the element orienter 385 has anisotropy between the intra-molecular dipole in the first axial direction and the intra-molecular dipole in a second axial direction perpendicular to the first axial direction, and such anisotropy may induce high dielectric anisotropy in the light emitting element 300. Accordingly, when the light emitting elements 300 are aligned in the display device 10, the alignment degree can be improved by increasing the dielectrophoretic reactivity according to the dielectric anisotropy.

Meanwhile, as will be described below, when the light emitting elements 300 are aligned between the electrodes 210 and 220, they may be coated on the electrodes 210 and 220 in a state of being dispersed in a coating solution S, and may be aligned by a dielectrophoretic (DEP) force through power application. Here, when dispersing the light emitting elements 300 in the coating solution S, by adding the element orienters 385 to the coating solution S, the element orienters 385 may be bonded to the insulating material layer 380 of the light emitting elements 300.

Figure 6:
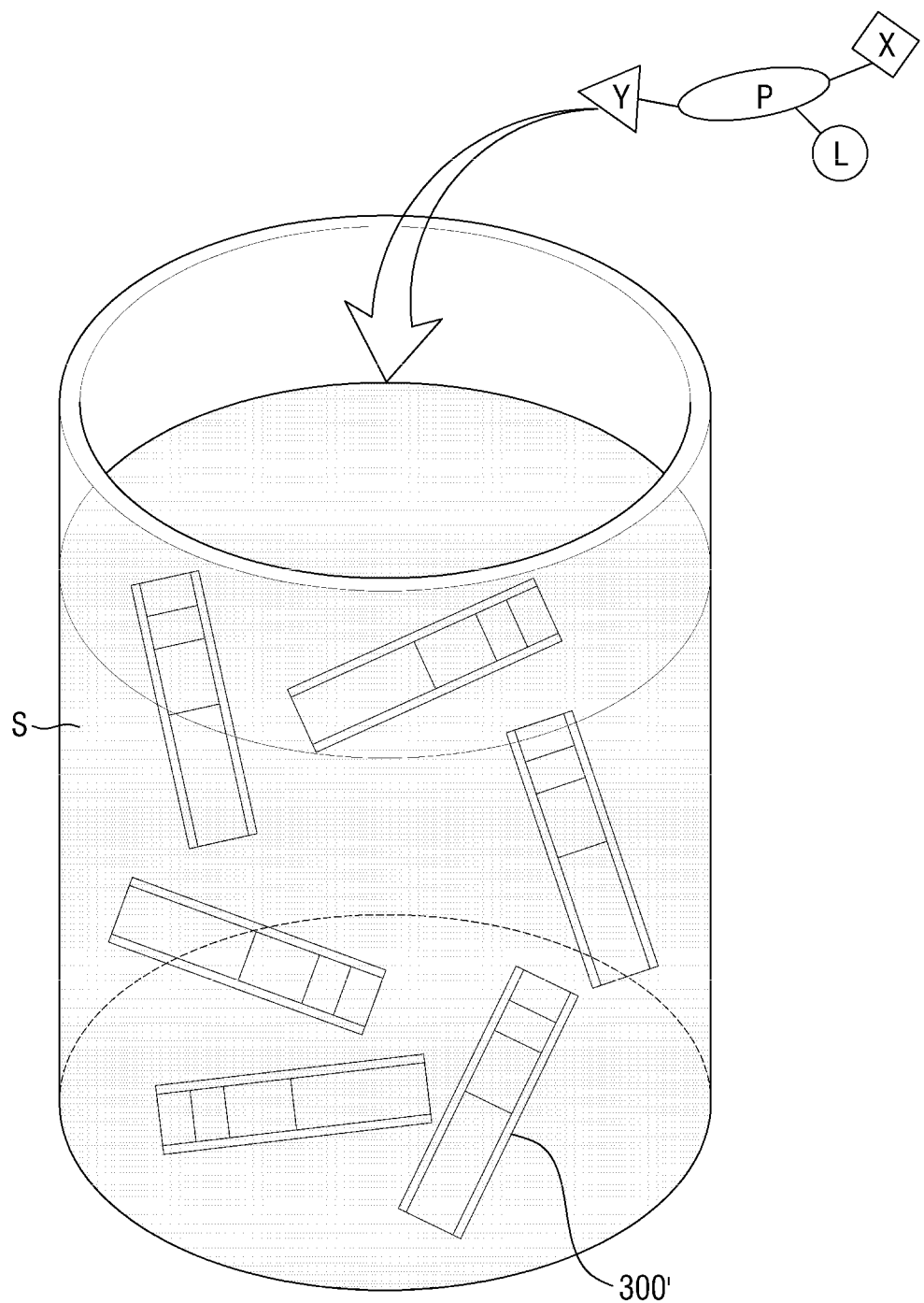
FIGS. 6 and 7 are schematic views showing a part of a method of manufacturing a light emitting element according to an embodiment.
Figure 7:
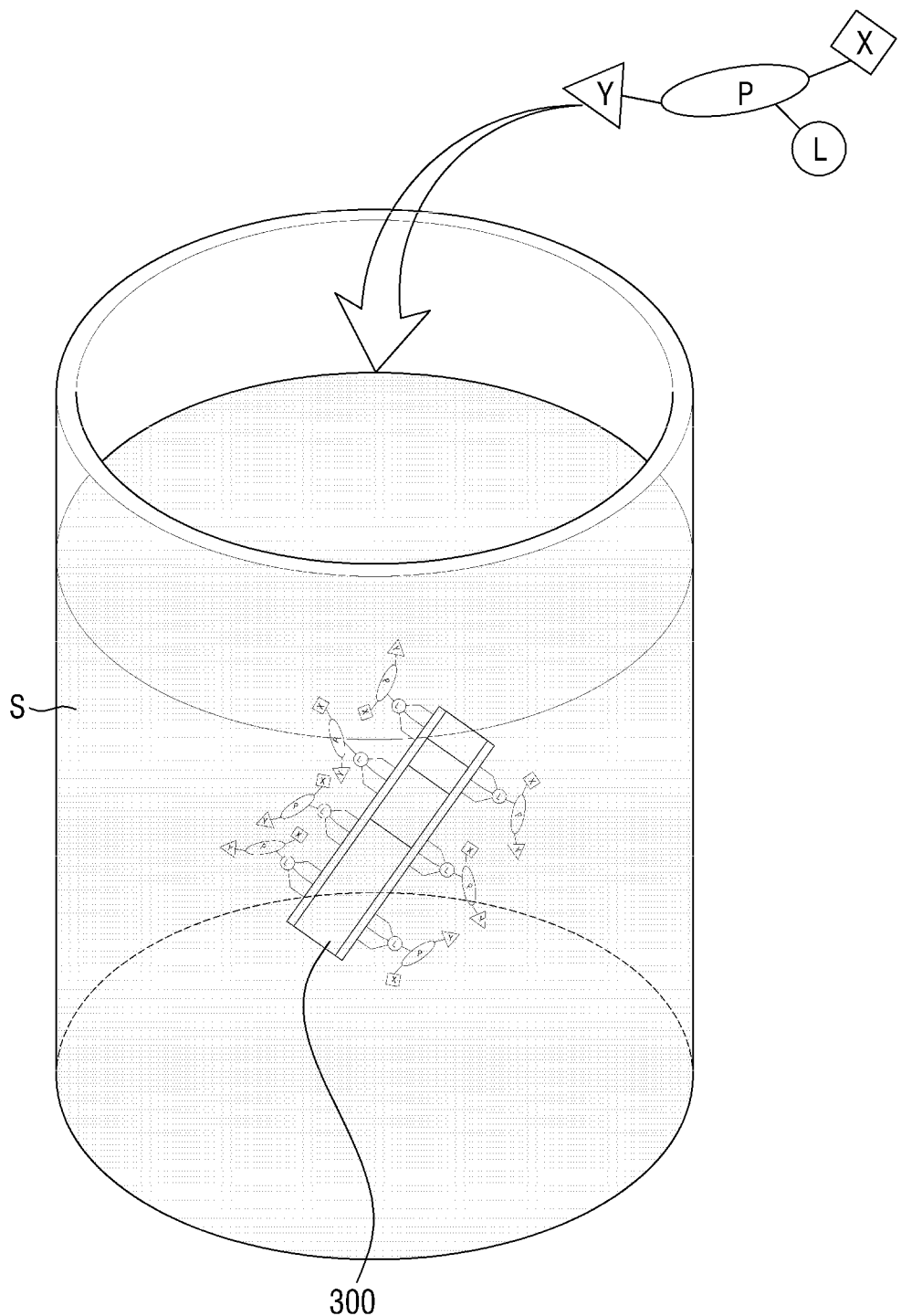

FIGS. 6 and 7 are schematic views showing apart of a method of manufacturing a light emitting element according to an embodiment.

Referring to FIGS. 6 and 7, first, light emitting elements 300' in which the element orienters 385 are not bonded to the surface of the insulating material film 381 are dispersed in the coating solution S. Element rods grown on the substrate by an epitaxial method are separated from the substrate, and the light emitting elements 300', to which the element orienters 385 are not bonded, are dispersed in the coating solution S. Since the light emitting elements 300' may have a larger density than the coating solution S, a process of stirring in the coating solution S may be performed to prevent precipitation.

Here, when the coating solution S is stirred, the element orienters 385 may be added to combine the insulating material film 381 of the light emitting elements 300' with the element orienters 385. For example, when the insulating material film 381 includes aluminum oxide ($Al_2O_3$), and the linking group 385b of the element orienter 385 includes a silane group, the silane group of the linking group 385b may react with the oxygen atom of aluminum oxide to form a covalent bond. Accordingly, the light emitting element 300 in which the element orienters 385 are bonded to the surface of the insulating material film 381 can be manufactured.

In the light emitting elements 300 dispersed in the coating solution S, the element orienters 385 may be arranged without directionality in a state in which no electric field is formed. In other words, since the linking group 385b of the element orienter 385 includes a single bond carbon chain, the element orienters 385 may be arranged in various directions by single bond rotation. The element orienters 385 may be arbitrarily arranged such that intra-molecular dipoles formed in the main chain portions 385a are oriented in different directions. However, after applying the coating solution S on the electrodes 210 and 220, when the capacitance is formed by the electric field of the AC power, the element orienters 385 may be arranged such that the intra-molecular dipoles of the main chain portions 385a are oriented in the same direction, thereby increasing the dielectric anisotropy of the light emitting element 300. The light emitting elements 300 may have improved dielectrophoretic reactivity, and may have a high degree of alignment between the electrodes 210 and 220. Amore detailed description will be given below.

Meanwhile, the coating solution S may have a formulation such as ink and/or paste, and may be any one or more selected from acetone, water, alcohol, and toluene. However, without being limited thereto, it is not particularly limited as long as it is a material that can be evaporated by heat or at room temperature.

Further, in some embodiments, the insulating material film 381 of the insulating material layer 380 may be further surface-treated with materials having different outer peripheral (e.g., circumferential) surfaces. As described above, when the light emitting elements 300 are aligned between the electrodes 210 and 220, the plurality of light emitting elements 300 may be applied in a dispersed state in a solution. Here, in order to keep the light emitting elements 300 in a dispersed state without aggregation with other light emitting elements 300 adjacent in the solution, the surface of the insulating material film 381 may be treated in a hydrophobic or hydrophilic manner such that they can maintain a mutually dispersed state in the solution. Accordingly, when the light emitting elements 300 are aligned, they may be aligned without aggregation between the first electrode 210 and the second electrode 220.

The light emitting element 300 may have a cylindrical shape. Accordingly, the light emitting element 300 may have a rectangular shape in the cross-sectional view taken in the longitudinal direction across both ends of the light emitting element 300. However, the shape of the light emitting element 300 is not limited thereto, and may have various shapes such as a regular cube, a rectangular parallelepiped and a hexagonal prism. The light emitting element 300 may have a length I of 1 μm to 10 μm or 2 μm to 5 μm, and preferably about 4 μm. In addition, the diameter of the light emitting element 300 may have a range of 400 nm to 700 nm, and preferably may be about 500 nm.

Referring to FIG. 2 again, the light emitting elements 300 may be arranged between the first electrode 210 and the second electrode 220, or between the first electrode branch 210B and the second electrode branch 220B. The light emitting elements 300 may be aligned by applying the coating solution S having the light emitting elements 300 dispersed therein on the first electrode 210 and the second electrode 220, and forming the capacitance between the first electrode 210 and the second electrode 220 by the electric field of the AC power. The capacitance may apply a dielectrophoretic (DEP) force $F_{DEP}$ to the light emitting elements 300 according to a change in the electric field, and the light emitting elements 300 may be aligned between the first electrode 210 and the second electrode 220 according to polarity. Here, in the insulating material layer 380 of the light emitting element 300, the element orienters 385 bonded to the insulating material film 381 may increase the dielectric anisotropy of the light emitting element 300, thereby improving the reactivity to the dielectrophoretic force $F_{DEP}$ applied to the light emitting element 300.

Figure 8:
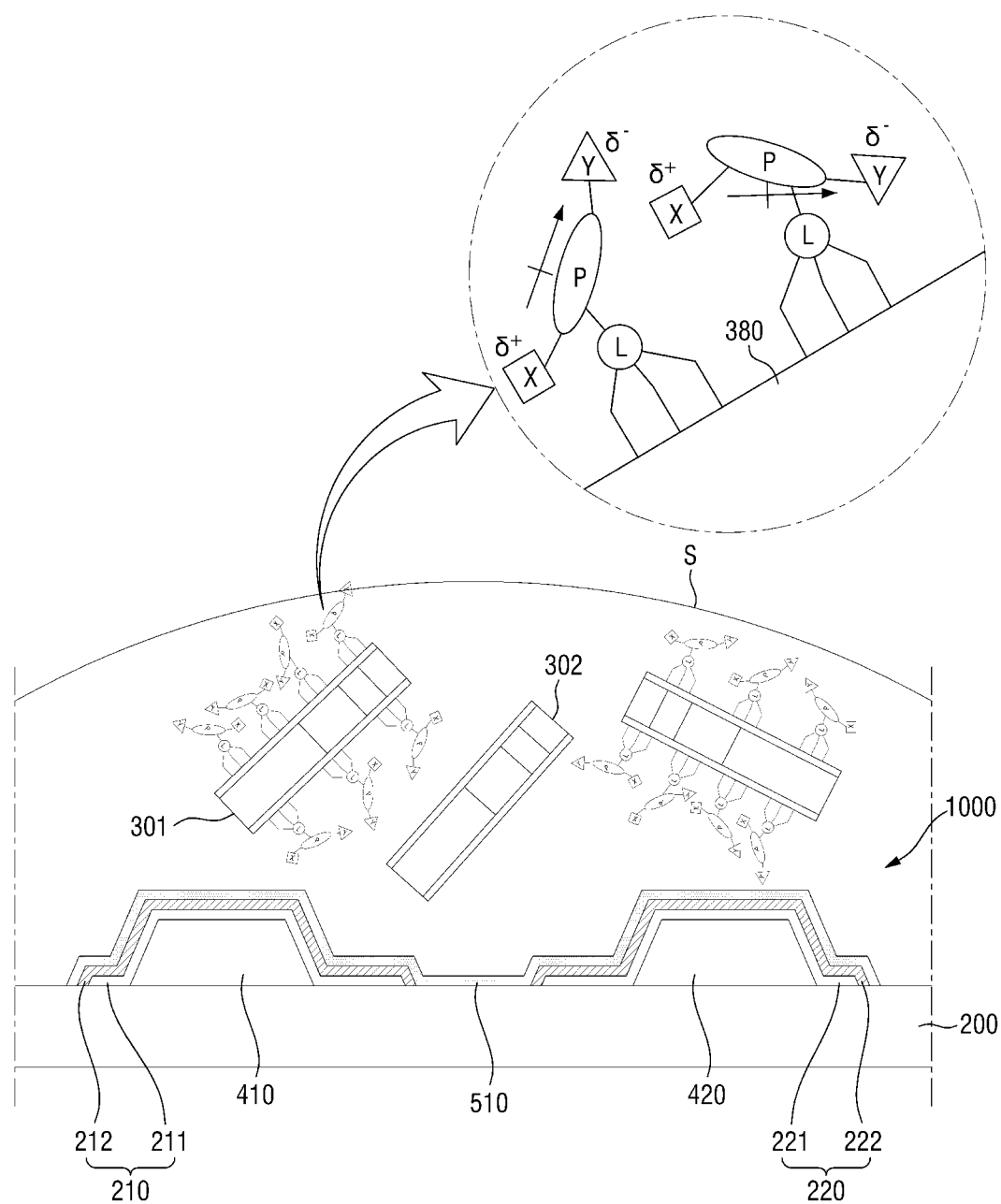
FIGS. 8 and 9 are schematic views showing a process in which light emitting elements according to an embodiment are aligned on electrodes.
Figure 9:
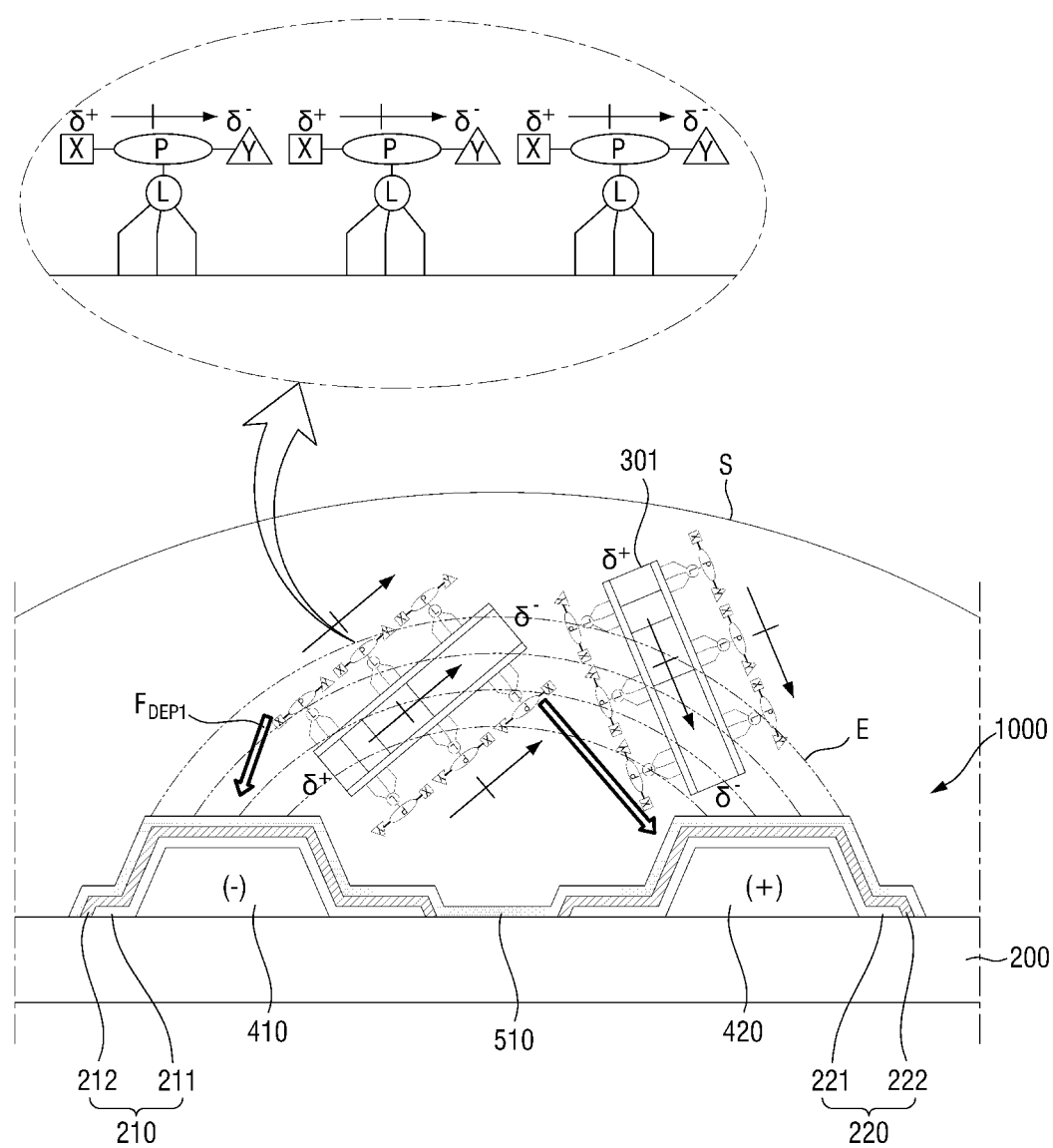
Figure 10:
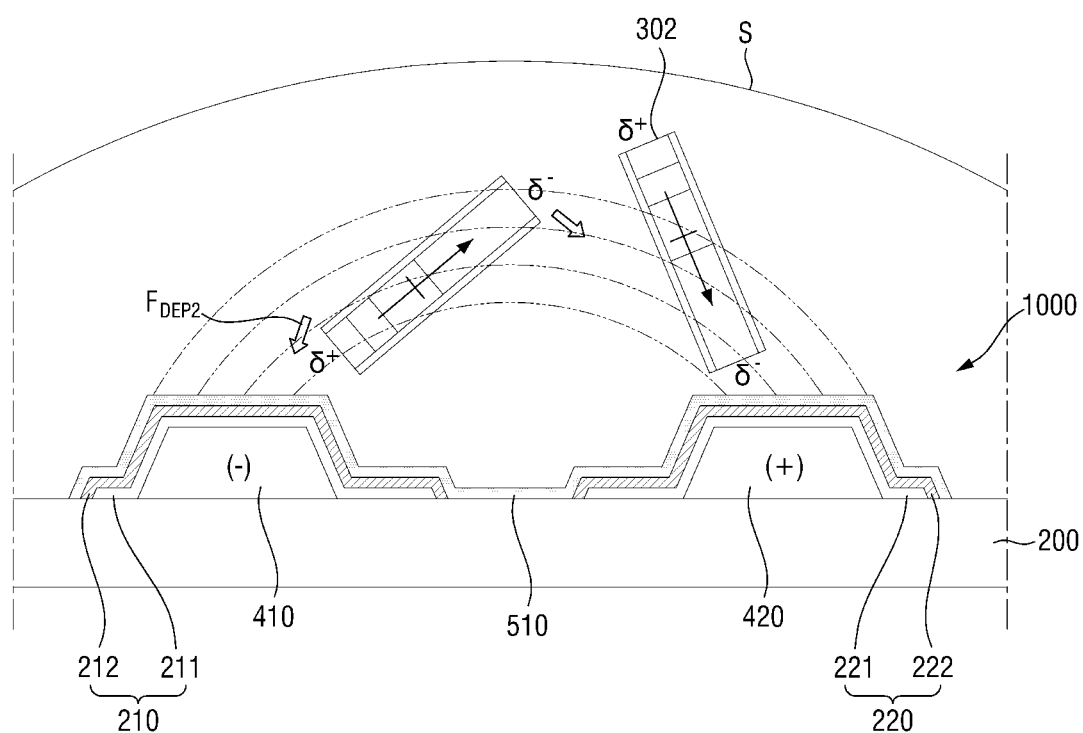
FIG. 10 is a schematic view showing a process in which light emitting elements according to a comparative example are aligned on electrodes.

FIGS. 8 and 9 are schematic views showing a process in which light emitting elements according to an embodiment are aligned on electrodes. FIG. 10 is a schematic view showing a process in which light emitting elements according to a comparative example are aligned on electrodes.

First, referring to FIG. 8, there is prepared a base substrate 1000 including the first electrode 210 and the second electrode 220 spaced apart from each other on the insulating substrate layer 200 (see FIG. 2), and the first insulating layer 510 covering them. The insulating substrate layer 200, the first electrode 210, the second electrode 220, and the first insulating layer 510 are the same as described above with reference to FIG. 2. However, the first insulating layer 510 may cover the first electrode 210 and the second electrode 220, and may be partially removed by being partially patterned in a subsequent process, as illustrated in FIG. 2.

The method of aligning the light emitting elements 300 may include applying the coating solution S having the light emitting elements 300 dispersed therein on the first electrode 210 and the second electrode 220. The method of applying the coating solution S may be performed by using various processes such as inkjet printing, inkjet injection, slot die coating, and/or slot die printing, without being limited thereto.

Although it is illustrating in FIG. 8 that one first electrode 210 and one second electrode 220 are respectively formed on the two banks 410 and 420, it is obvious that the method of applying the coating solution S can be applied in the same way even when the first electrode 210 is further on the other bank as shown in FIG. 1. Further, hereinafter, for simplicity of description, among the light emitting elements 300 dispersed in the coating solution S, the light emitting element 300 in which the element orienters 385 are bonded to the insulating material layer 380 is defined as a first light emitting element 301, and the light emitting element 300 in which the element orienters 385 are not bonded to the insulating material layer 380 is defined as a second light emitting element 302. In addition, although the drawing shows a case in which there are seven element orienters 385 bonded to the first light emitting element 301, this is the number shown for simplicity of description, and a larger number of element orienters 385 may be bonded.

As described above, the element orienter 385 bonded to the first light emitting element 301 may form an intra-molecular dipole as the resonance structure of the main chain portion 385a (P) is stabilized by the first functional group 385c and the second functional group 385d. In the example of FIG. 8, the first functional group 385c (X) is an electron donor group (EDG), and the second functional group 385d (Y) is an electron withdrawing group (EWG).

Accordingly, referring to the enlarged view of FIG. 8, by the resonance structure of the main chain portion 385a (P), the first functional group 385c (X) may exhibit a positive charge, the second functional group 385d (Y) may exhibit a negative charge, and the intra-molecular dipole of the element orienter 385 may be directed from the first functional group 385c to the second functional group 385d. However, the present disclosure is not limited thereto, and the same can be applied to the opposite case. That is, the second functional group 385d (Y) may be the electron donor group (EDG), and the first functional group 385c (X) may be the electron withdrawing group (EWG).

In addition, in FIG. 8, it can be seen that the element orienter 385 is oriented in any direction without directionality by single bond rotation of the carbon chain of the linking group 385b (L) because the capacitance is not formed by the electric field of the AC power between the first electrode 210 and the second electrode 220.

Next, referring to FIGS. 9 and 10, when AC power is applied to the first electrode 210 and the second electrode 220 to form an electric field E, the capacitance formed in the coating solution S may apply the dielectrophoretic force $F_{DEP}$ to the light emitting element 300.

First, referring to FIG. 9, in the case of the first light emitting element 301 to which the element orienters 385 are bonded, partial charges may also be formed in the first light emitting element 301 by the capacitance formed by the electric field E. For example, a negative charge may be formed in the n-type doped first conductivity type semiconductor 310, and a positive charge may be formed in the p-type doped second conductivity type semiconductor 320 or electrode material layer 370. Also in the first light emitting element 301, an intra-element dipole may be formed in a direction from the first conductivity type semiconductor 310 to the second conductivity type semiconductor 320 according to partial charge distribution. However, the present disclosure is not limited thereto, and an opposite case may also be possible.

The dielectrophoretic force $F_{DEP}$ may be applied to the first light emitting element 301 by the intra-element dipole formed by the first conductivity type semiconductor 310 and the second conductivity type semiconductor 320 of the first light emitting element 301, and the first light emitting element 301 may be aligned according to polarities of the first electrode 210 and the second electrode 220. Here, the element orienters 385 bonded to the insulating material layer 380 of the first light emitting element 301 may be oriented such that the intra-molecular dipoles have the same orientation by the capacitance formed by the electric field E, unlike the case of FIG. 8.

Referring to the enlarged view of FIG. 9, the element orienters 385 may be oriented such that the intra-molecular dipoles are oriented according to the direction of the capacitance formed by the electric field E. That is, the element orienters 385 may be oriented such that the intra-molecular dipoles of the element orienters 385 are oriented in any one direction. The intra-molecular dipoles of the element orienters 385 and the intra-element dipole of the first light emitting element 301 may be oriented by the capacitance formed by the electric field E, and may be oriented in the same direction. In other words, the direction of the intra-element dipole of the first light emitting element 301 may be parallel to the direction in which the first conductivity type semiconductor 310, the element active layer 330, the second conductivity type semiconductor 320, and the electrode material layer 370 are sequentially stacked, and the element orienters 385 may be oriented to be parallel to the direction in which the above-mentioned layers are sequentially stacked. Accordingly, the first light emitting element 301 may increase the dielectric anisotropy in the coating solution S by the intra-element dipole and the intra-molecular dipoles of the element orienters 385.

On the other hand, referring to FIG. 10, in the case of the second light emitting element 302 to which the element orienters 385 are not bonded, only the intra-element dipole is formed by the capacitance formed by the electric field E. Accordingly, the second light emitting element 302 may have a lower dielectric anisotropy than the first light emitting element 301.

As the dielectric anisotropy of the first light emitting element 301 increases, the dielectrophoretic reactivity of first light emitting element 301 is improved compared to the second light emitting element 302. Accordingly, a first dielectrophoretic force $F_{DEP1}$ applied to the first light emitting element 301 by the capacitance may be greater than a second dielectrophoretic force $F_{DEP2}$ applied to the second light emitting element 302 by the capacitance. Accordingly, the first light emitting element 301 to which the element orienters 385 are bonded may be subjected to a relatively strong dielectrophoretic force $F_{DEP}$ when aligned between the first electrode 210 and the second electrode 220, so that the degree of alignment can be improved.

When aligning the light emitting element 300, if the dielectrophoretic force $F_{DEP}$ is weak, it may be aligned such that both ends of the light emitting element 300 are not in contact with the first electrode 210 and the second electrode 220. Even if only one end of the light emitting element 300 contacts one selected from the electrodes 210 and 220, when the light emitting element 300 is not vertically aligned with each of the electrodes 210 and 220, the other end of the light emitting element 300 may not be in contact with the other one selected from the electrodes 210 and 220. In this case, a contact failure of the contact electrode 260 contacting the light emitting element 300 may occur.

On the other hand, the light emitting elements 300 with improved alignment may be aligned so that both ends thereof may contact the first electrode 210 and the second electrode 220. By controlling the alignment of the light emitting elements 300, it is possible to reduce the contact failure between the light emitting element 300 and each of the electrodes 210 and 220, and to align the light emitting elements 300 in a direction perpendicular to the extending direction (e.g., second direction D2) of each of the electrodes 210 and 220. Also, the number of light emitting elements 300 aligned in one pixel PX may be adjusted.

Accordingly, the display device 10 including the light emitting elements 300 having a high degree of alignment can reduce connection or contact failures between the light emitting elements 300 and the electrodes 210 and 220 or the contact electrode 260, and eliminate a defect of each pixel PX of the display device 10 to thereby improve the reliability of the display device 10.

In concluding the detailed description, those skilled in the art will appreciate that many variations and modifications can be made to the preferred embodiments without substantially departing from the principles of the present disclosure. Therefore, the disclosed preferred embodiments of the present disclosure are used in a generic and descriptive sense only and not for purposes of limitation.

The invention claimed is:

1. A light emitting element comprising:
   a first conductivity type semiconductor doped to have a first polarity;
   an active layer on the first conductivity type semiconductor;
   a second conductivity type semiconductor on the active layer and doped to have a second polarity different from the first polarity; and
   an insulating material layer surrounding side surfaces of the first conductivity type semiconductor, the second conductivity type semiconductor, and the active layer,
   wherein the insulating material layer comprises an insulating material film and an element orienter bonded to an outer peripheral surface of the insulating material film.

2. The light emitting element of claim 1, wherein the element orienter comprises a compound represented by the following chemical structural formula (1):

[Chemical Structural Formula (1)]

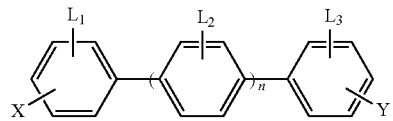

where X is —OR or —NR$_2$, Y is one selected from —NR$_3$+, —C$_m$F$_l$ and —CN, at least one selected from L$_1$, L$_2$ and L$_3$ is one selected from —Si(OR)$_3$, —Si(OR)$_3$, —(R)Si(OH)$_3$, —(R)Si(OR)$_3$, —B(OH)$_2$, —B(OR)$_2$, —(R)B(OR)$_2$ and —(R)B(OR)$_2$, the other is hydrogen (H), each R is independently one selected from hydrogen, a C$_1$-C$_6$ alkyl group, a C$_1$-C$_6$ alkenyl group and a C$_1$-C$_6$ alkynyl group, n is an integer of 0 to 3, and m and l are each independently an integer of 1 to 10.

3. The light emitting element of claim 2, wherein the element orienter comprises at least one selected from compounds represented by the following chemical structural formulas (1-1) to (1-12):

[Chemical Structural Formula (1-1)]

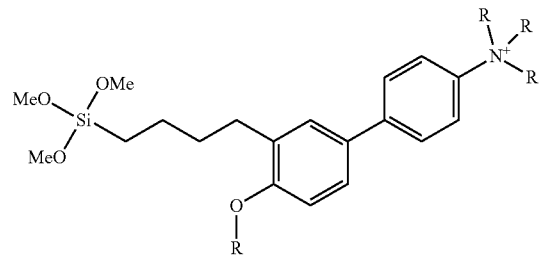

[Chemical Structural Formula (1-2)]

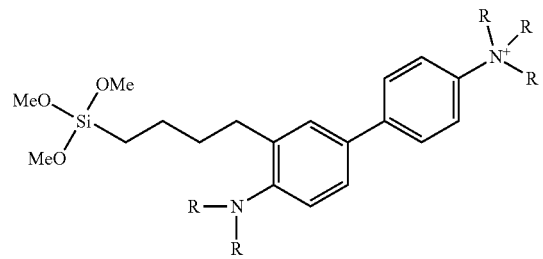

[Chemical Structural Formula (1-3)]

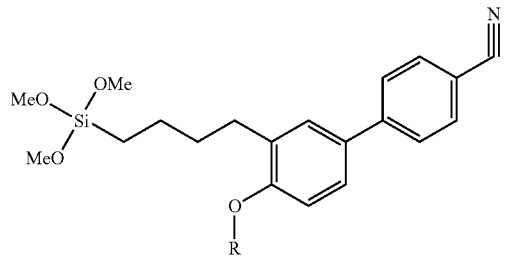

-continued

[Chemical Structural Formula (1-4)]

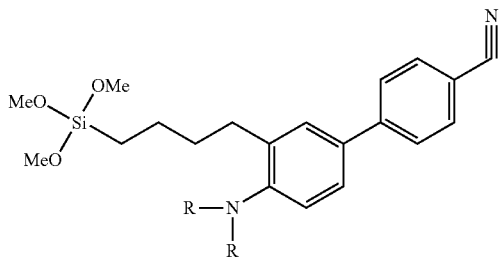

[Chemical Structural Formula (1-5)]

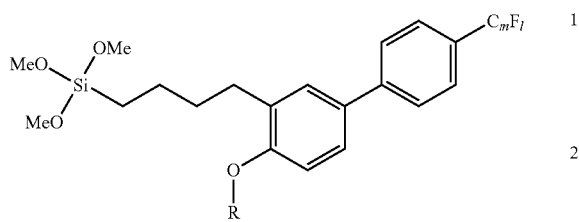

[Chemical Structural Formula (1-6)]

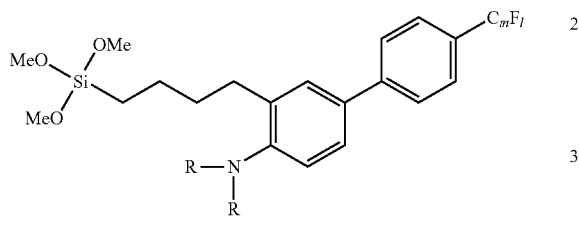

[Chemical Structural Formula (1-7)]

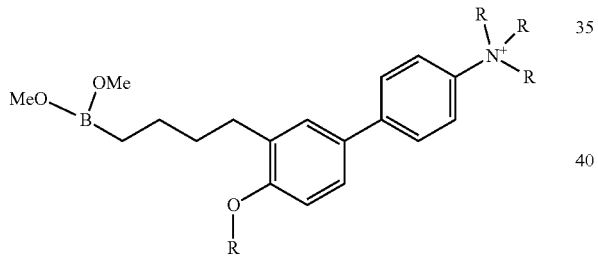

[Chemical Structural Formula (1-8)]

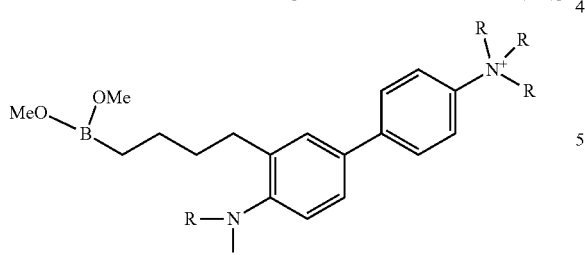

[Chemical Structural Formula (1-9)]

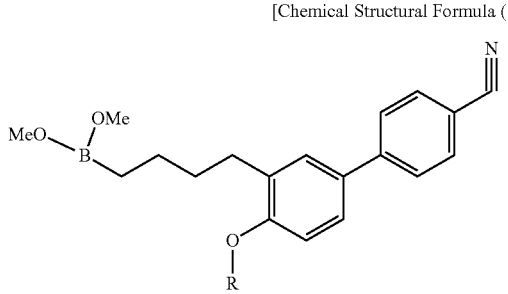

[Chemical Structural Formula (1-10)]

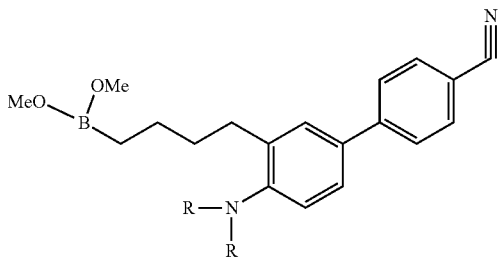

[Chemical Structural Formula (1-11)]

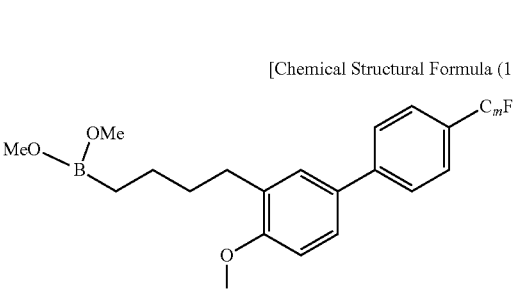

[Chemical Structural Formula (1-12)]

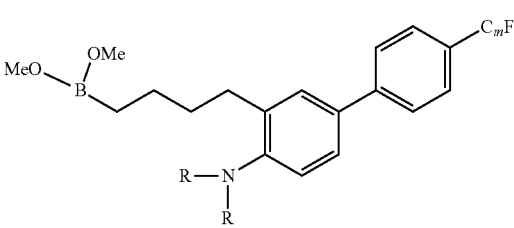

where each R is independently one selected from hydrogen, a $C_1$-$C_6$ alkyl group, a $C_1$-$C_6$ alkenyl group and a $C_1$-$C_6$ alkynyl group, and m and l are each independently an integer of 1 to 10.

4. The light emitting element of claim 1, wherein the element orienter comprises a compound represented by the following chemical structural formula (2):

[Chemical Structural Formula (2)]

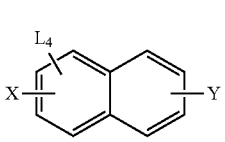

where X is —OR or —NR$_2$, Y is one selected from —NR$_3^+$, —C$_m$F$_l$ and —CN, L$_4$ is one selected from —Si(OH)$_3$, —Si(OR)$_3$, —(R)Si(OH)$_3$, —(R)Si(OR)$_3$, —B(OH)$_2$, —B(OR)$_2$, —(R)B(OH)$_2$ and —(R)B(OR)$_2$, each R is independently one selected from hydrogen, a $C_1$-$C_6$ alkyl group, a $C_1$-$C_6$ alkenyl group and a $C_1$-$C_6$ alkynyl group, and m and l are each an integer of 1 to 5.

5. The light emitting element of claim 4, wherein the element orienter comprises at least one of compounds represented by the following chemical structural formulas (2-1) to (2-12):

[Chemical Structural Formula (2-1)]

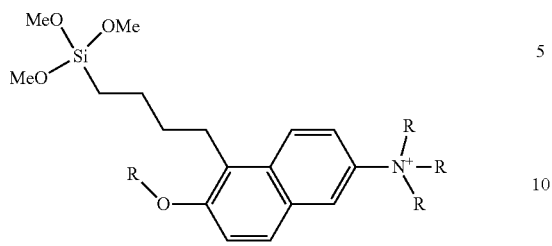

[Chemical Structural Formula (2-2)]

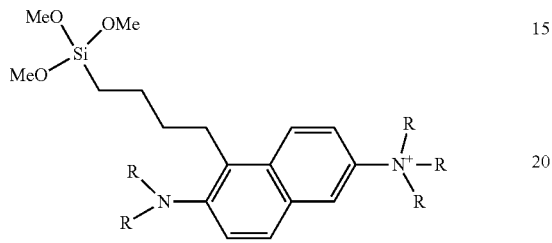

[Chemical Structural Formula (2-3)]

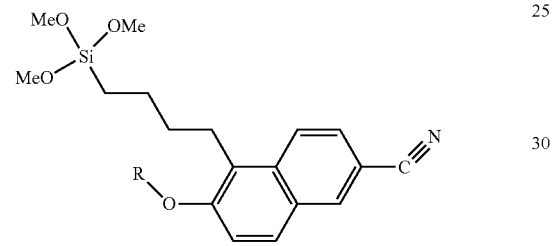

[Chemical Structural Formula (2-4)]

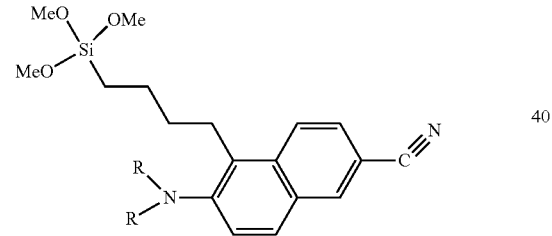

[Chemical Structural Formula (2-5)]

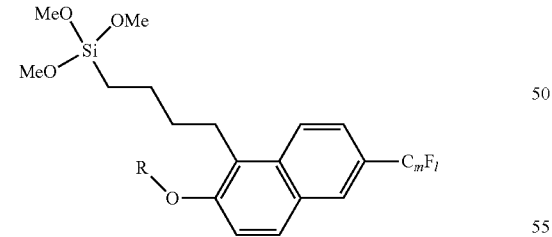

[Chemical Structural Formula (2-6)]

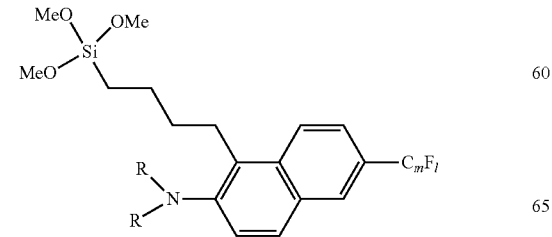

[Chemical Structural Formula (2-7)]

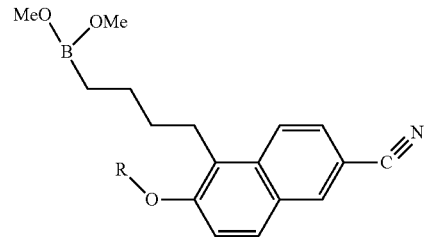

[Chemical Structural Formula (2-8)]

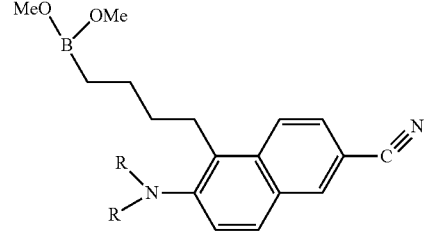

[Chemical Structural Formula (2-9)]

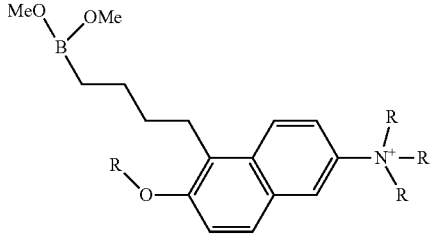

[Chemical Structural Formula (2-10)]

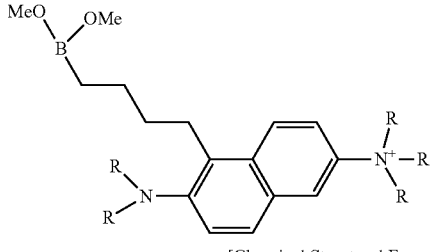

[Chemical Structural Formula (2-11)]

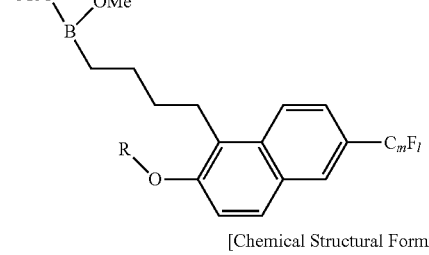

[Chemical Structural Formula (2-12)]

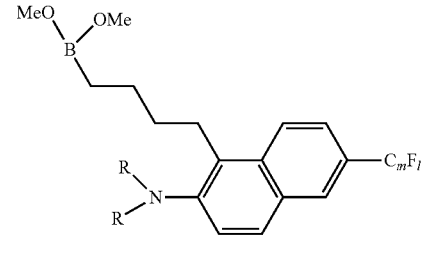

where each R is independently one selected from hydrogen, a $C_1$-$C_6$ alkyl group, a $C_1$-$C_6$ alkenyl group and a $C_1$-$C_6$ alkynyl group, and m and l are each independently an integer of 1 to 10.

6. The light emitting element of claim 1, wherein the element orienter comprises a main chain portion, a linking group bonded to the main chain portion, and a first functional group and a second functional group bonded to the main chain portion.

7. The light emitting element of claim 6, wherein the main chain portion comprises at least one phenyl group, and the first functional group and the second functional group stabilize an intra-molecular dipole formed in the main chain portion.

8. The light emitting element of claim 7, wherein the first functional group comprises an electron donor group, and the second functional group comprises an electron withdrawing group.

9. The light emitting element of claim 8, wherein the linking group forms a covalent bond together with an element included in the insulating material film.

10. The light emitting element of claim 7, wherein the linking group comprises a carbon chain comprising at least one single bond, and the element orienter is oriented in any direction.

11. The light emitting element of claim 10, wherein the element orienter is oriented to be parallel to a direction in which the first conductivity type semiconductor, the active layer, and the second conductivity type semiconductor are sequentially stacked.

12. A display device comprising:
a substrate;
at least one first electrode and at least one second electrode extending in a first direction on the substrate and spaced apart from each other in a second direction different from the first direction;
at least one light emitting element in a separation space between the first electrode and the second electrode;
a first contact electrode partially covering the first electrode and contacting a first end of the light emitting element; and
a second contact electrode spaced apart from the first contact electrode and partially covering the second electrode to contact a second end opposite to the first end of the light emitting element,
wherein the light emitting element comprises an element rod and an insulating material layer surrounding an outer peripheral surface of the element rod, and the insulating material layer comprises an insulating material film and an element orienter bonded to an outer peripheral surface of the insulating material film.

13. The display device of claim 12, wherein the element rod comprises:
a first conductivity type semiconductor doped to have a first polarity;
an active layer on the first conductivity type semiconductor; and
a second conductivity type semiconductor on the active layer and doped to have a second polarity opposite to the first polarity,
wherein the insulating material layer surrounds side surfaces of the first conductivity type semiconductor, the active layer, and the second conductivity type semiconductor.

14. The display device of claim 13, wherein the light emitting element is aligned such that the first conductivity type semiconductor, the active layer, and the second conductivity type semiconductor are sequentially disposed in a direction parallel to the second direction between the first electrode and the second electrode.

15. The display device of claim 14, wherein the element orienter comprises a main chain portion, a linking group bonded to the main chain portion, and a first functional group and a second functional group substituted in the main chain portion, and
the element orienter is oriented to be substantially parallel to a direction in which the first conductivity type semiconductor, the active layer, and the second conductivity type semiconductor are sequentially disposed.

16. A method for manufacturing a display device, comprising:
providing a base substrate comprising a substrate, at least one first electrode and at least one second electrode spaced apart from each other on the substrate, and an insulating layer covering the first electrode and the second electrode;
applying a coating solution in which light emitting elements are dispersed onto the first electrode and the second electrode of the base substrate; and
aligning the light emitting elements between the first electrode and the second electrode by forming an electric field between the first electrode and the second electrode,
wherein the light emitting element comprises an element rod and an insulating material layer surrounding an outer peripheral surface of the element rod, and
the insulating material layer comprises an insulating material film and an element orienter bonded to an outer peripheral surface of the insulating material film.

17. The method of claim 16, wherein the element rod comprises:
a first conductivity type semiconductor doped to have a first polarity;
an active layer on the first conductivity type semiconductor; and
a second conductivity type semiconductor on the active layer and doped to have a second polarity opposite to the first polarity,
wherein in the aligning of the light emitting elements, a dipole in the light emitting element is formed between the first conductivity type semiconductor and the second conductivity type semiconductor.

18. The method of claim 17, wherein in the aligning of the light emitting elements, the element orienter is oriented such that a direction of the dipole in the light emitting element is substantially parallel to a direction of an intra-molecular dipole of the element orienter, and dielectric anisotropy of the light emitting element is increased.

19. The method of claim 18, wherein the light emitting elements are aligned between the first electrode and the second electrode such that the first conductivity type semiconductor, the active layer, and the second conductivity type semiconductor are sequentially disposed in a direction parallel to a direction in which the first electrode and the second electrode are spaced apart from each other.

* * * * *